(12) United States Patent
Sum et al.

(10) Patent No.: US 10,962,578 B2
(45) Date of Patent: Mar. 30, 2021

(54) DISTRIBUTED SMART GRID PROCESSING

(71) Applicant: SILVER SPRING NETWORKS, INC., Redwood City, CA (US)

(72) Inventors: Charles P. Sum, Cupertino, CA (US); George H. Flammer, III, Redwood City, CA (US)

(73) Assignee: ITRON NETWORKED SOLUTIONS, INC., Liberty Lake, WA (US)

( * ) Notice: Subject to any disclaimer, the term of this patent is extended or adjusted under 35 U.S.C. 154(b) by 48 days.

(21) Appl. No.: 14/643,985

(22) Filed: Mar. 10, 2015

(65) Prior Publication Data

US 2015/0256433 A1 Sep. 10, 2015

Related U.S. Application Data

(60) Provisional application No. 61/950,425, filed on Mar. 10, 2014, provisional application No. 62/045,423, (Continued)

(51) Int. Cl.
*G06F 15/173* (2006.01)
*G01R 25/00* (2006.01)
(Continued)

(52) U.S. Cl.
CPC ............ *G01R 25/00* (2013.01); *G01R 21/00* (2013.01); *H02J 3/00* (2013.01); *H02J 3/24* (2013.01);
(Continued)

(58) Field of Classification Search
USPC ........................................................ 709/224
See application file for complete search history.

(56) References Cited

U.S. PATENT DOCUMENTS 8,059,541 B2    11/2011 Karagiannis et al.
8,161,152 B2 *   4/2012 Ogielski ................. H04L 41/00
                                                  709/224
(Continued)

FOREIGN PATENT DOCUMENTS

CN        103002005 A     3/2013
EP          2651099 A1   10/2013
(Continued)

OTHER PUBLICATIONS

International Search Report and Written Opinion for Application No. PCT/US2015/019733 dated Jun. 17, 2015.
(Continued)

*Primary Examiner* — Hee Soo Kim
(74) *Attorney, Agent, or Firm* — Artegis Law Group, LLP

(57) ABSTRACT

Nodes within a wireless mesh network are configured to monitor time series data associated with a utility network, including voltage fluctuations, current levels, temperature data, humidity measurements, and other observable physical quantities. The nodes execute stream functions to process the recorded time series data and generate data streams. The node is configured to transmit generated data streams to neighboring nodes. A neighboring node may execute other stream functions to process the received data stream(s), thereby generating additional data streams. A server coupled to the wireless mesh network collects and processes the data streams to identify events occurring within the network.

26 Claims, 12 Drawing Sheets

Related U.S. Application Data filed on Sep. 3, 2014, provisional application No. 62/094,907, filed on Dec. 19, 2014.

(51) Int. Cl.

| | |
|---|---|
| *H02J 3/00* | (2006.01) |
| *G01R 21/00* | (2006.01) |
| *H04L 29/08* | (2006.01) |
| *H04L 29/06* | (2006.01) |
| *H04L 12/24* | (2006.01) |
| *H02J 13/00* | (2006.01) |
| *H02J 3/24* | (2006.01) |
| *H04L 12/26* | (2006.01) |
| *H02J 3/06* | (2006.01) |

(52) U.S. Cl.
CPC .... *H02J 13/00022* (2020.01); *H02J 13/0075* (2013.01); *H04L 41/0803* (2013.01); *H04L 41/0896* (2013.01); *H04L 41/12* (2013.01); *H04L 43/0876* (2013.01); *H04L 43/0888* (2013.01); *H04L 67/125* (2013.01); *H04L 67/16* (2013.01); *H04L 69/28* (2013.01); *H02J 3/007* (2020.01); *H02J 3/06* (2013.01); *H02J 2203/20* (2020.01); *H04L 43/04* (2013.01); *Y02E 60/00* (2013.01); *Y04S 40/00* (2013.01); *Y04S 40/126* (2013.01); *Y04S 40/18* (2018.05); *Y04S 40/20* (2013.01)

(56) References Cited

U.S. PATENT DOCUMENTS

| | | |
|---|---|---|
| 8,417,938 B1 | 4/2013 | Considine et al. |
| 8,478,800 B1 | 7/2013 | Johnson et al. |
| 8,504,689 B2 | 8/2013 | Ferris et al. |
| 8,595,642 B1 | 11/2013 | Lagassey |
| 8,612,615 B2 | 12/2013 | Ferris et al. |
| 8,630,283 B1 | 1/2014 | Breau et al. |
| 8,659,302 B1 | 2/2014 | Warren et al. |
| 8,713,147 B2 | 4/2014 | Ferris et al. |
| 8,862,728 B2 | 10/2014 | Jayachandran et al. |
| 8,887,169 B2 | 11/2014 | Wang |
| 8,903,593 B1 | 12/2014 | Addepalli et al. |
| 9,129,086 B2 | 9/2015 | Betz et al. |
| 9,288,123 B1 | 3/2016 | Safford et al. |
| 9,294,552 B2 | 3/2016 | Jimenez et al. |
| 9,319,372 B2 | 4/2016 | Deurloo |
| 9,396,287 B1 | 7/2016 | Bhave et al. |
| 2002/0005798 A1 | 1/2002 | Wada et al. |
| 2002/0016639 A1 | 2/2002 | Smith et al. |
| 2003/0065805 A1 | 4/2003 | Barnes, Jr. |
| 2003/0126276 A1 | 7/2003 | Kime et al. |
| 2004/0012491 A1* | 1/2004 | Kulesz .................. G08B 21/12 340/506 |
| 2004/0036261 A1 | 2/2004 | Breed |
| 2006/0088013 A1 | 4/2006 | Ganesh |
| 2008/0100436 A1 | 5/2008 | Banting et al. |
| 2008/0140471 A1 | 6/2008 | Ramsey et al. |
| 2008/0209568 A1 | 8/2008 | Chang et al. |
| 2008/0264164 A1 | 10/2008 | Solheim et al. |
| 2008/0317050 A1 | 12/2008 | Xiong et al. |
| 2009/0187658 A1* | 7/2009 | Williams .................. H04L 67/32 709/226 |
| 2010/0088150 A1 | 4/2010 | Mazhar et al. |
| 2010/0146085 A1 | 6/2010 | Van Wie et al. |
| 2010/0198655 A1 | 8/2010 | Ketchum et al. |
| 2010/0257227 A1 | 10/2010 | McLaughlin et al. |
| 2010/0286937 A1 | 11/2010 | Hedley et al. |
| 2011/0077790 A1 | 3/2011 | Vaswani et al. |
| 2011/0078302 A1 | 3/2011 | Dehaan et al. |
| 2011/0298301 A1 | 12/2011 | Wong et al. |
| 2011/0307623 A1 | 12/2011 | George et al. |
| 2011/0314320 A1* | 12/2011 | Chang .................. H02J 13/0017 713/340 |
| 2012/0060142 A1 | 3/2012 | Fliess et al. |
| 2012/0066670 A1 | 3/2012 | McCarthy et al. |
| 2012/0079097 A1 | 3/2012 | Gopisetty et al. |
| 2012/0117392 A1* | 5/2012 | Turicchi, Jr. ........... G06Q 50/06 713/300 |
| 2012/0136909 A1 | 5/2012 | Wang et al. |
| 2012/0137126 A1 | 5/2012 | Matsuoka et al. |
| 2012/0150775 A1 | 6/2012 | Son et al. |
| 2012/0153824 A1 | 6/2012 | Neate |
| 2012/0197898 A1 | 8/2012 | Pandey et al. |
| 2012/0203388 A1 | 8/2012 | DiLuciano et al. |
| 2012/0239468 A1 | 9/2012 | Yemeni et al. |
| 2012/0254400 A1 | 10/2012 | Iyengar et al. |
| 2012/0259583 A1* | 10/2012 | Noboa ................ H02J 13/0062 702/179 |
| 2012/0290651 A1* | 11/2012 | Westbrooke ............. H04Q 9/00 709/204 |
| 2012/0297016 A1 | 11/2012 | Iyer et al. |
| 2012/0310423 A1* | 12/2012 | Taft ........................ G06Q 50/06 700/286 |
| 2012/0310424 A1 | 12/2012 | Taft |
| 2013/0013125 A1 | 1/2013 | Booth |
| 2013/0013284 A1 | 1/2013 | Wang et al. |
| 2013/0060933 A1* | 3/2013 | Tung ........................ G06F 11/30 709/224 |
| 2013/0061306 A1 | 3/2013 | Sinn |
| 2013/0139152 A1 | 5/2013 | Chang et al. |
| 2013/0198050 A1 | 8/2013 | Shroff et al. |
| 2013/0208966 A1 | 8/2013 | Zhao et al. |
| 2013/0227569 A1 | 8/2013 | Kohli et al. |
| 2013/0229947 A1 | 9/2013 | Vaswani et al. |
| 2013/0262035 A1* | 10/2013 | Mills ................ G06F 16/24568 702/188 |
| 2013/0262642 A1 | 10/2013 | Kutch |
| 2013/0275527 A1 | 10/2013 | Deurloo |
| 2013/0275528 A1 | 10/2013 | Miner et al. |
| 2013/0276089 A1 | 10/2013 | Tseitlin et al. |
| 2013/0305093 A1 | 11/2013 | Jayachandran et al. |
| 2013/0325924 A1 | 12/2013 | Moshfeghi |
| 2014/0012524 A1 | 1/2014 | Flammer, III |
| 2014/0012574 A1 | 1/2014 | Pasupalak et al. |
| 2014/0012954 A1* | 1/2014 | Dorn ........................ G01D 4/002 709/219 |
| 2014/0013244 A1 | 1/2014 | Lindsay et al. |
| 2014/0047107 A1 | 2/2014 | Maturana et al. |
| 2014/0058572 A1 | 2/2014 | Stein et al. |
| 2014/0122729 A1 | 5/2014 | Hon et al. |
| 2014/0146052 A1 | 5/2014 | Takamura et al. |
| 2014/0156806 A1 | 6/2014 | Karpistsenko et al. |
| 2014/0250153 A1* | 9/2014 | Nixon ..................... G05B 15/02 707/812 |
| 2014/0310714 A1 | 10/2014 | Chan et al. |
| 2014/0337274 A1 | 11/2014 | Unnikrishnan |
| 2014/0337429 A1 | 11/2014 | Asenjo et al. |
| 2014/0346972 A1 | 11/2014 | Tran |
| 2014/0366155 A1 | 12/2014 | Chang et al. |
| 2015/0006716 A1 | 1/2015 | Suchter et al. |
| 2015/0019301 A1 | 1/2015 | Jung et al. |
| 2015/0032464 A1 | 1/2015 | Vesto |
| 2015/0033120 A1 | 1/2015 | Cooke et al. |
| 2015/0052992 A1 | 2/2015 | Pabst |
| 2015/0058447 A1 | 2/2015 | Albisu |
| 2015/0097961 A1 | 4/2015 | Ure et al. |
| 2015/0106881 A1 | 4/2015 | Wharton et al. |
| 2015/0199010 A1 | 7/2015 | Coleman et al. |
| 2015/0212663 A1 | 7/2015 | Papale et al. |
| 2015/0215332 A1 | 7/2015 | Curcic et al. |
| 2015/0222495 A1 | 8/2015 | Mehta et al. |
| 2015/0233962 A1 | 8/2015 | Tchoryk et al. |
| 2015/0235035 A1 | 8/2015 | Tseitlin et al. |
| 2015/0248452 A1 | 9/2015 | Dillenberger et al. |
| 2015/0295765 A1 | 10/2015 | Dickey |
| 2015/0304337 A1 | 10/2015 | Nguyen-Tuong et al. |
| 2016/0125083 A1 | 5/2016 | Dou et al. |
| 2016/0216698 A1 | 7/2016 | Yoshida et al. |
| 2016/0239264 A1 | 8/2016 | Mathur et al. |
| 2016/0239756 A1* | 8/2016 | Aggour ................ H04L 41/142 |

(56) References Cited

U.S. PATENT DOCUMENTS

| | | |
|---|---|---|
| 2016/0254944 A1 | 9/2016 | Larsson et al. |
| 2017/0201606 A1 | 7/2017 | Ding et al. |
| 2017/0316048 A1 | 11/2017 | Papageorgiou et al. |

FOREIGN PATENT DOCUMENTS

| | | |
|---|---|---|
| WO | 2012/166872 A2 | 12/2012 |
| WO | 2013/006273 A2 | 1/2013 |

OTHER PUBLICATIONS

International Search Report and Written Opinion for Application No. PCT/US15/19703 dated Jul. 28, 2015.
Extended European Search Report for Application No. EP 15761205.2 dated Jul. 10, 2017, 13 pages.
Extended European Search Report for Application No. EP 15761724.2 dated Aug. 30, 2017, 7 pages.
Zhang et al., "Time-Series Pattern Based Effective Noise Generation for Privacy Protection on Cloud", 2015.
Buyya et al., "Intercloud: Utility-Oriented Federation of Cloud Computing Environments for Scaling of Application Services", "Algorithms and Architectures for Parallel Processing", 2010, pp. 13-31 (Year: 2010).
Wikipedia, "time series", 2017.
Akyildiz et al., "A Survey on Sensor Networks", 2002.
Akyildiz et al., "Wireless sensor networks: a survey", 2002.
Chong et al., "Sensor Networks: Evolution, Opportunities, and Challenges", 2003.
Krishnamachari et al., "Distributed Bayesian Algorithms for Fault-Tolerant Event Region Detection in Wireless Sensor Networks", 2004.
Lu et al., "RAP: A Real-Time Communication Architecture for Large_scale Wireless Sensor Networks", 2002.
Stankovic et al., "Real-Time Communication and Coordination in Embedded Sensor Networks", 2003.
European Search report for application No. 18205149.0 dated Mar. 8, 2019.
Tyson, Jeff, "How the Old Napster Worked", URL : http://computer.howstuffworks.com/napster.html, HowStuffWorks.com, Oct. 30, 2000, 5 pages.
Beal, "Cloud Computing", NIST Cloud Computing Introduction and Definition, webopedia, 2018, 1 pages.
Notice of Allowance for U.S. Appl. No. 14/644,003, dated Jul. 15, 2019, 28 pages.
Advisory Action dated Nov. 14, 2018 for U.S. Appl. No. 14/643,978, 5 pages.
Final Office Action received for U.S. Appl. No. 14/643,978, dated Aug. 7, 2018, 39 pages.
Non-Final Office Action received for U.S. Appl. No. 14/643,978, dated Apr. 25, 2019, 35 pages.
Non-Final Office Action received for U.S. Appl. No. 14/643,978, dated Nov. 18, 2016, 29 pages.
Final Office Action received for U.S. Appl. No. 14/643,978, dated Jun. 20, 2017, 26 pages.
Non-Final Office Action received for U.S. Appl. No. 14/643,978, dated Jan. 10, 2018, 22 pages.
Final Office Action received for U.S. Appl. No. 14/643,978, dated Oct. 31, 2019, 80 pages.

* cited by examiner

DISTRIBUTED SMART GRID PROCESSING

CROSS-REFERENCE TO RELATED APPLICATIONS

This application claims the benefit of U.S. provisional patent application titled "Smart Grid Processing to Evaluate Grid Conditions," filed on Mar. 10, 2014, and having Ser. No. 61/950,425, U.S. provisional patent application titled "Distributed Smart Grid Processing," filed on Sep. 3, 2014 and having Ser. No. 62/045,423, and United States provisional patent application titled "Distributed Smart Grid Processing," filed on Dec. 19, 2014 and having Ser. No. 62/094,907. The subject matter of each of these related applications is hereby incorporated by reference.

BACKGROUND OF THE INVENTION

Field of the Invention

Embodiments of the present invention relate generally to network architecture and semantics for distributed processing on a data pipeline, and, more specifically, to distributed smart grid processing.

Description of the Related Art

A conventional electricity distribution infrastructure typically includes a plurality of energy consumers, such as houses, business, and so forth, coupled to a grid of intermediate distribution entities, such as transformers, feeders, substations, etc. The grid of distribution entities draws power from upstream power plants and distributes that power to the downstream consumers. In a modern electricity distribution infrastructure, the consumers, as well as the intermediate distribution entities, may include smart meters and other monitoring hardware coupled together to form a mesh network. The smart meters and other measurement and control devices collect data that reflects the operating state of the grid, as well as consumption and utilization of the grid, and then report the collected data, via the mesh network, to a centralized grid management facility, often referred to as the "back office." Such a configuration is commonly known as a "smart grid."

In a conventional smart grid, the back office receives a multitude of real-time data from the various smart meters, stores that data in a database as historical data, and then performs different computations with the historical data to identify specific operating conditions associated with the grid. Those conditions may include electrical events, such as sags or swells, as well as physical events, such as downed power lines or overloaded transformers, among other possibilities. The back office usually includes centralized processing hardware, such as a server room or datacenter, configured to execute "big data" processing across the smart meter data stored in the database. Such big data processing may include warehouse processing techniques or batch processing, among other techniques.

One problem with approach described above is that, with the expansion of smart grid infrastructure, the amount of data that must be transmitted to the back office, stored in the database, and then processed, is growing quickly. Consequently, the mesh network across which the smart meters transmit data may become over-burdened with traffic and, therefore, suffer from throughput issues. In addition, the processing hardware implemented by the back office may quickly become obsolete as the amount of data that must be processed grows. As a general matter, the infrastructure required to transport and process data generated by a smart grid cannot scale as quickly as the amount of data that is generated.

As the foregoing illustrates, what is needed in the art is a more effective approach for evaluating real-time and historical conditions that arise within a smart grid architecture.

SUMMARY OF THE INVENTION

One embodiment of the present invention sets forth a computer-implemented method for generating a time series of data values, including obtaining a first time series of data values having a first type, obtaining a second time series of data values having a second type, executing a first stream function on at least a portion of the first time series and at least a portion of the second time series to generate a third time series of data values having a third type, and transmitting the third time series to at least one network management entity configured to manage at least a portion of a network.

At least one advantage of the techniques set forth herein is that data processing occurs at edges of the network, i.e., locations where the data is actually collected. Thus, complex processing involving the network as a whole can be broken down into granular, atomic processing steps that are performed, in a distributed and real-time fashion, across the network.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

In the following disclosure, a multi-layered network architecture is described that includes a utility network, illustrated in FIG. 1, a wireless mesh network, illustrated in FIG. 2, and a stream network, illustrated in FIG. 5. The utility network includes hardware configured to transport and distribute electricity. The wireless mesh network includes hardware nodes residing within elements of that utility network, where those nodes are configured to execute firmware and/or software to (i) monitor the utility network and (ii) establish and maintain the wireless mesh network. In addition, the nodes are also configured to execute firmware and/or software to generate the stream network. The stream network includes time series data that is generated and processed by the nodes, and shared between nodes via the wireless mesh network. The stream network operates above the wireless mesh network, which, in turn, operates above the electricity distribution layer.

Figure 1:
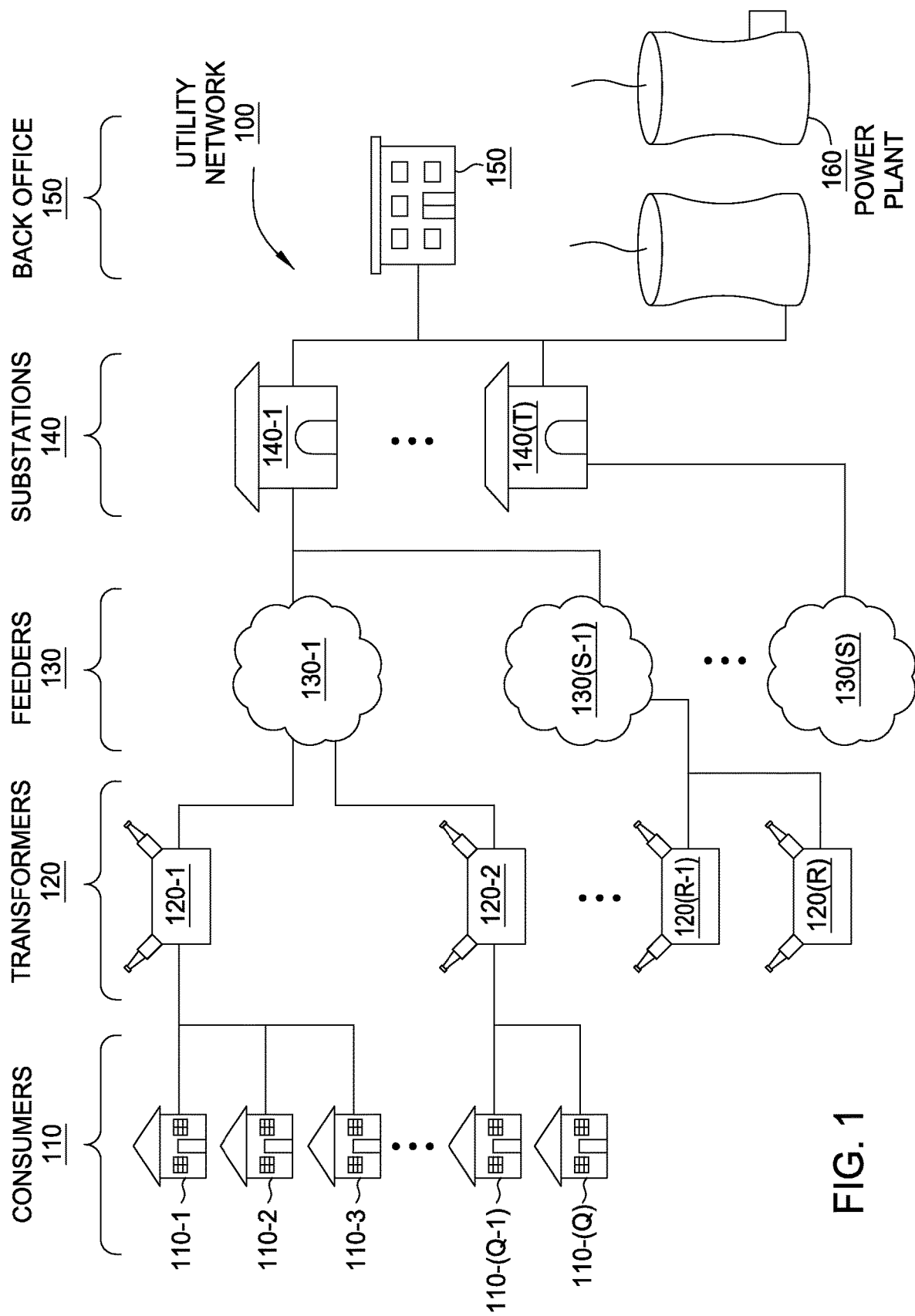
FIG. 1 illustrates a utility network configured to implement an electricity distribution infrastructure, according to one embodiment of the present invention.

FIG. 1 illustrates a utility network 100 configured to implement an electricity distribution infrastructure, according to one embodiment of the present invention. As shown, utility network 100 includes consumer 110, transformers 120, feeders 130, substations 140, and a back office 150, coupled together in a sequence. Substations 140(1) through 140(T) are configured to draw power from one or more power plants 160 and to distribute that power to feeders 130(1) through 130(S). Feeders 130, in turn, distribute that power to transformers 120(1) through 120(R). Transformers 120 step down high-voltage power transported by feeders 130 to a low-voltage power, and then transmit the low-voltage power to consumers 110(1) through 110(Q). Consumers 110 include houses, business, and other consumers of power.

Each of consumers 110, transformers 120, feeders 130, and substations 140 may include one or more instances of a node. In the context of this disclosure, a "node" refers to a computing device that is coupled to an element of utility network 100 and includes a sensor array and a wireless transceiver. An exemplary node is described below in conjunction with FIG. 3. Each such node is configured to monitor operating conditions associated with a specific portion of the utility network 100. For example, consumer 110(1) could include a node configured to monitor a number of kilowatt-hours consumed by consumer 110(1). In another example, transformer 120(R−1) could include a node configured to monitor voltage levels or temperature at transformer 120(R−1). In yet another example, feeder 130(S) could include one or more nodes configured to monitor humidity percentages or wind velocities at various locations associated with feeder 130(S). As a general matter, the nodes within utility network 110 may be smart meters, Internet of Things (IoT) devices configured to stream data, or other computing devices. The nodes within utility network 100 may be configured to record physical quantities associated with power distribution and consumption along utility network 100, record physical quantities associated with the environment where utility network 100 resides, record quality of service data, or record any other technically feasible type of data.

The nodes residing within utility network 100 are configured to communicate with one another to form an interconnected wireless mesh network. An exemplary wireless mesh network is described in greater detail below in conjunction with FIG. 2. Back office 150 is coupled to this wireless mesh network and configured to coordinate the overall operation of the network and the corresponding nodes. In doing so, back office 150 configures nodes to record specific data and to establish communication with neighboring nodes. In addition, back office 150 programs the nodes to execute "stream functions" to process incoming time series data, thereby generating data streams. In one embodiment, this configuration is performed in a distributed processing cloud. The incoming time series data could include raw data recorded at the node, or data streams received from neighboring nodes. Back office 150 collects the generated data streams, and, by processing those streams, identifies various events occurring within utility network 100. Back office 150 may then take specific actions in response to those identified events. Some or all of the processing performed by back office 150 may occur within the distributed processing cloud mentioned above.

Figure 2:
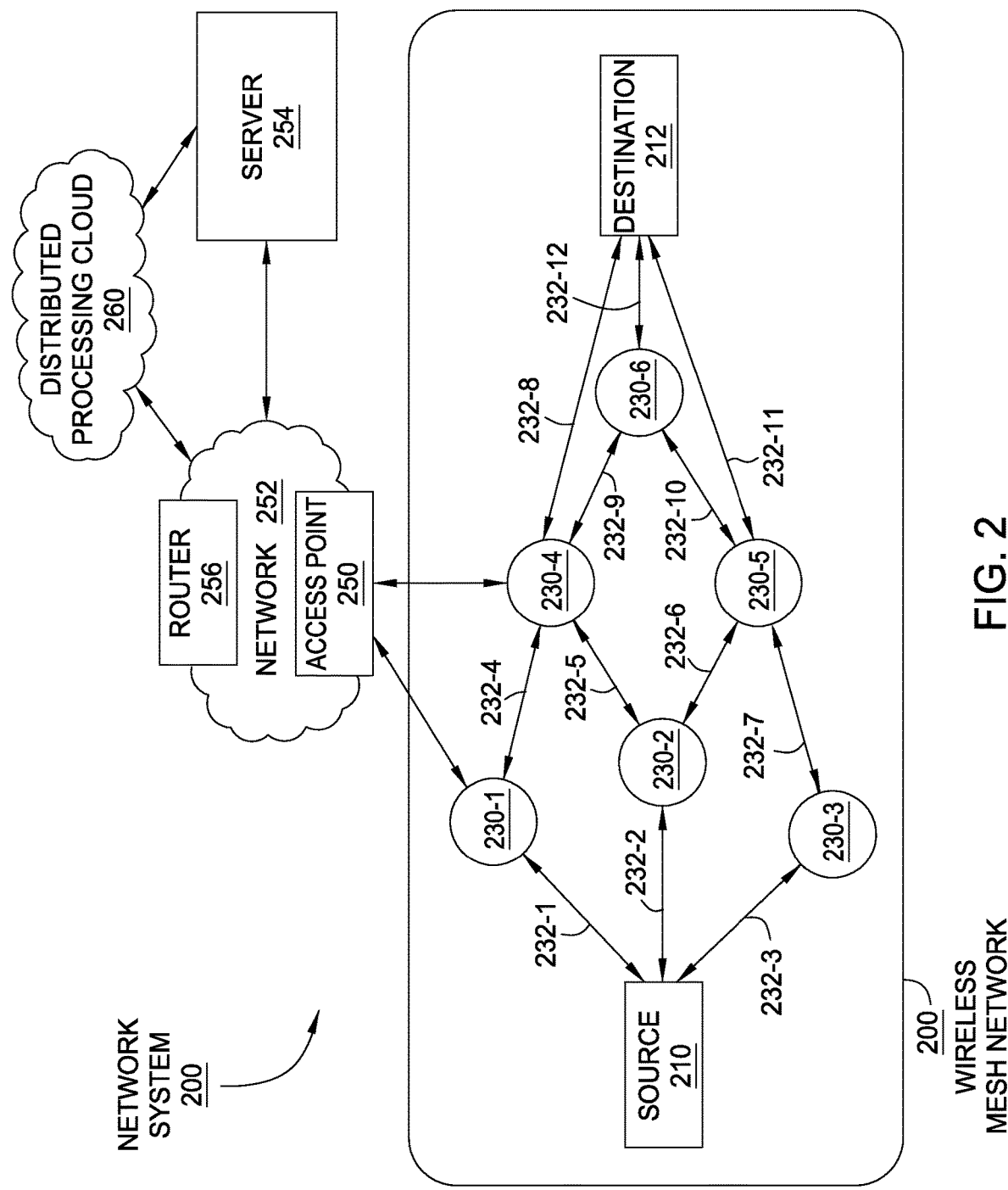
FIG. 2 illustrates a mesh network that operates in conjunction with the utility network of FIG. 1, according to one embodiment of the present invention.

FIG. 2 illustrates a mesh network that operates in conjunction with utility network 100 of FIG. 1, according to one embodiment of the present invention. As shown, a network system 200 includes a wireless mesh network 202, which may include a source node 210, intermediate nodes 230 and destination node 212. Source node 210 is able to communicate with certain intermediate nodes 230 via communication links 232. Intermediate nodes 230 communicate amongst themselves via communication links 232. Intermediate nodes 230 communicate with destination node 212 via communication links 232. Network system 200 may also include an access point 250, a network 252, a server 254, and a router 256. Network 252 and server 254 may be coupled to a distributed processing cloud 260, which generally resides outside of network system 200. As mentioned above in conjunction with FIG. 1, a given node 230 (or a source node 210 or a destination node 212) may reside within any of the elements of utility network 100, including consumers 110, transformers 120, and so forth.

A discovery protocol may be implemented to determine node adjacency to one or more adjacent nodes. For example, intermediate node 230-2 may execute the discovery protocol to determine that nodes 210, 230-4, and 230-5 are adjacent to node 230-2. Furthermore, this node adjacency indicates that communication links 232-2, 232-5, and 232-6 may be established with nodes 110, 230-4, and 230-5, respectively. Any technically feasible discovery protocol, including one related to IoT principles, may be implemented without departing from the scope and spirit of embodiments of the present invention.

The discovery protocol may also be implemented to determine the hopping sequences of adjacent nodes, i.e., the sequence of channels across which nodes periodically receive payload data. As is known in the art, a "channel" may correspond to a particular range of frequencies. Once adjacency is established between source node 210 and at least one intermediate node 230, source node 210 may generate payload data for delivery to destination node 212, assuming a path is available. The payload data may comprise an Internet protocol (IP) packet, an Ethernet frame, or any other technically feasible unit of data. Similarly, any technically feasible addressing and forwarding techniques may be implemented to facilitate delivery of the payload data from source node 210 to destination node 212. For example, the payload data may include a header field configured to include a destination address, such as an IP address or Ethernet media access control (MAC) address.

Each intermediate node 230 may be configured to forward the payload data based on the destination address. Alternatively, the payload data may include a header field configured to include at least one switch label to define a predetermined path from source node 210 to destination node 212. A forwarding database may be maintained by each intermediate node 230 that indicates which of communication links 232 should be used and in what priority to transmit the payload data for delivery to destination node 212. The forwarding database may represent multiple paths to the destination address, and each of the multiple paths may include one or more cost values. Any technically feasible type of cost value may characterize a link or a path within network system 200. In one embodiment, each node within wireless mesh network 202 implements substantially identical functionality and each node may act as a source node, destination node or intermediate node.

In network system 200, access point 250 is configured to communicate with at least one node within wireless mesh network 202, such as intermediate node 230-4. Communication may include transmission of payload data, timing data, or any other technically relevant data between access point 250 and the at least one node within wireless mesh network 202. For example, a communication link may be established between access point 250 and intermediate node 230-4 to facilitate transmission of payload data between wireless mesh network 202 and network 252. Network 252 is coupled to server 254 via a communications link. Access point 250 is coupled to network 252, which may comprise any wired, optical, wireless, or hybrid network configured to transmit payload data between access point 250 and server 254.

In one embodiment, server 254 represents a destination for payload data originating within wireless mesh network 202 and a source of payload data destined for one or more nodes within wireless mesh network 202. Server 254 generally resides within back office 150 of FIG. 1 or is coupled thereto. For example, server 254 could be implemented by a datacenter that includes a number of different computing devices networked together and coupled to back office 150. In one embodiment, server 254 executes an application for interacting with nodes within wireless mesh network 202. For example, nodes within wireless mesh network 202 may perform measurements to generate data that reflects operating conditions of utility network 100 of FIG. 1, including, e.g., power consumption data, among other measurements. Server 254 may execute an application to collect, process, and report those measurements. In one embodiment, server 254 queries nodes 230 within wireless mesh network 202 for certain data. Each queried node replies with the requested data, such as consumption data, system status, health data, and so forth. In an alternative embodiment, each node within wireless mesh network 202 autonomously reports certain data, which is collected by server 254 as the data becomes available via autonomous reporting.

As described in greater detail below in conjunction with FIGS. 4-11, server 254 is configured to establish and maintain the aforementioned stream network that operates above wireless mesh network 202. More specifically, server 254 configures the nodes 230 within wireless mesh network 202 to implement "stream functions" in order to process real-time data and generate data streams. A stream function may be any technically feasible algorithm for processing and/or monitoring real-time data. A data stream represents real-time data that is generated by execution of a stream function. The stream network generally includes the various data streams and the paths through mesh network 202 followed by those data streams. The stream network is described in greater detail below in conjunction with FIG. 5.

In one embodiment, server 150 may interact with distributed processing cloud 260 to perform some or all of the stream network configuration and stream function execution. Distributed processing cloud 260 may be a private or a public distributed processing cloud, or some combination thereof. Distributed processing cloud 260 may define a configurable data processing pipeline that affects a logical data network path above the physical node paths within mesh network 102.

The techniques described herein are sufficiently flexible to be utilized within any technically feasible network environment including, without limitation, a wide-area network (WAN) or a local-area network (LAN). Moreover, multiple network types may exist within a given network system 200. For example, communications between two nodes 230 or between a node 230 and the corresponding access point 250 may be via a radio-frequency local-area network (RF LAN), while communications between multiple access points 250 and the network may be via a WAN such as a general packet radio service (GPRS). As mentioned above, each node 230 within wireless mesh network 202 includes a network interface that enables the node to communicate wirelessly with other nodes. An exemplary network interface is described below in conjunction with FIG. 3.

Figure 3:
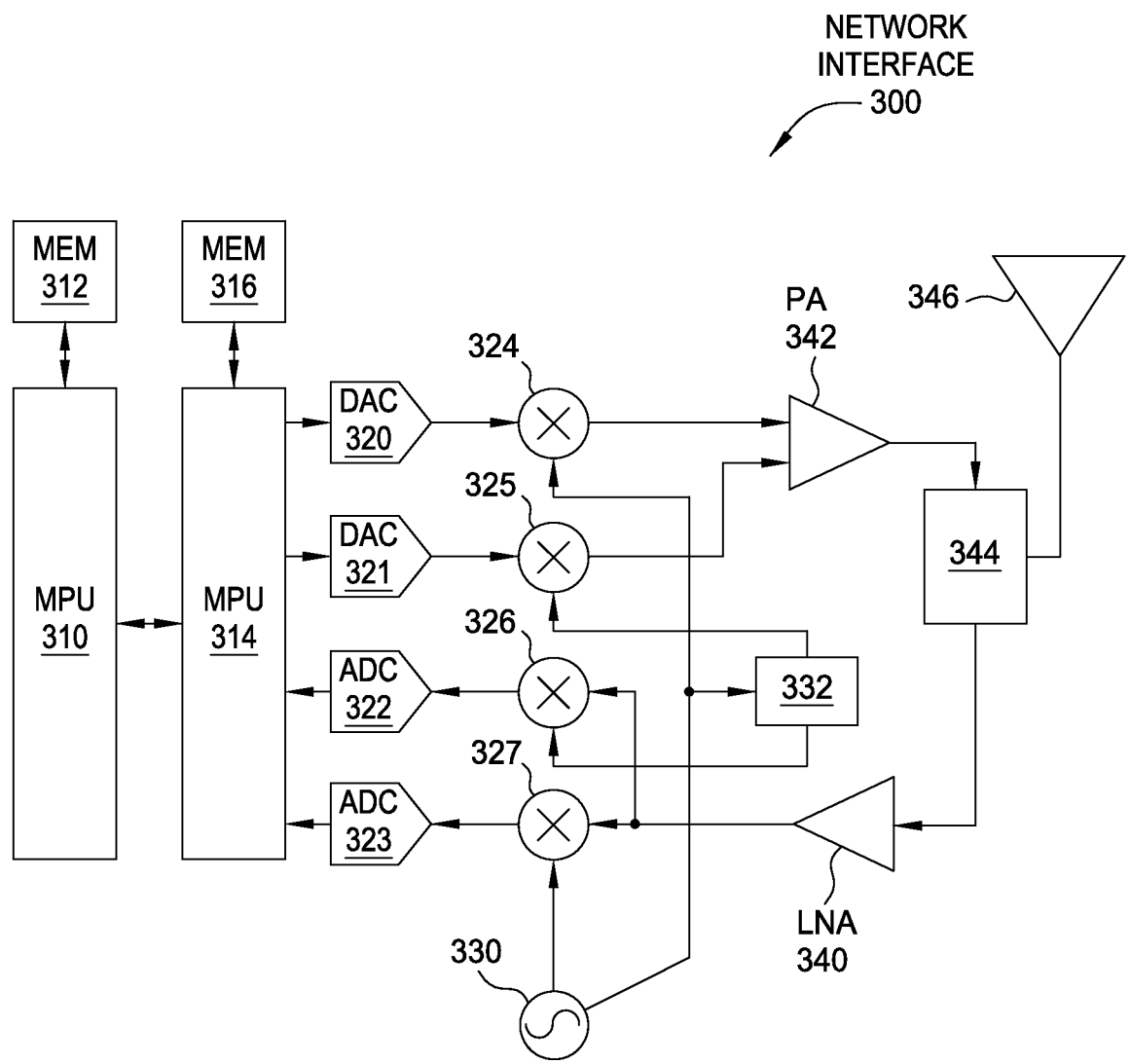
FIG. 3 illustrates a network interface configured to implement multi-channel operation, according to one embodiment of the present invention.

FIG. 3 illustrates a network interface 300 configured to implement multi-channel operation, according to one embodiment of the invention. Each node 210, 212, 230 within wireless mesh network 202 of FIG. 1 includes at least one instance of network interface 300. Network interface 300 may include, without limitation, a microprocessor unit (MPU) 310, a digital signal processor (DSP) 314, digital to analog converters (DACs) 320 and 321, analog to digital converters (ADCs) 322 and 323, analog mixers 324, 325, 326, and 327, a phase shifter 332, an oscillator 330, a power amplifier (PA) 342, a low noise amplifier (LNA) 340, an antenna switch 344, and an antenna 346. A memory 312 may be coupled to MPU 310 for local program and data storage. Similarly, a memory 316 may be coupled to DSP 314 for local program and data storage. Memory 312 and/or memory 316 may be used to store data structures such as, e.g., a forwarding database, and/or routing tables that include primary and secondary path information, path cost values, and so forth.

In one embodiment, MPU 310 implements procedures for processing IP packets transmitted or received as payload data by network interface 300. The procedures for processing the IP packets may include, without limitation, wireless routing, encryption, authentication, protocol translation, and routing between and among different wireless and wired network ports. In one embodiment, MPU 310 implements the techniques performed by the node, as described in conjunction with FIGS. 2 and 4-11, when MPU 310 executes firmware and/or software programs stored in memory within network interface 300.

MPU 314 is coupled to DAC 320 and DAC 321. Each DAC 320, 321 is configured to convert a stream of outbound digital values into a corresponding analog signal. The outbound digital values are computed by the signal processing procedures for modulating one or more channels. MPU 314 is also coupled to ADC 322 and ADC 323. Each of ADC 322 and 323 is configured to sample and quantize an analog signal to generate a stream of inbound digital values. The inbound digital values are processed by the signal processing procedures to demodulate and extract payload data from the inbound digital values. Persons having ordinary skill in the art will recognize that network interface 300 represents just one possible network interface that may be implemented within wireless mesh network 202 shown in FIG. 2, and that any other technically feasible device for transmitting and receiving data may be incorporated within any of the nodes within wireless mesh network 202. As a general matter, server 254 of FIG. 2 configures and manages the operation of each node 230 where network interface 300 resides.

Figure 4A:
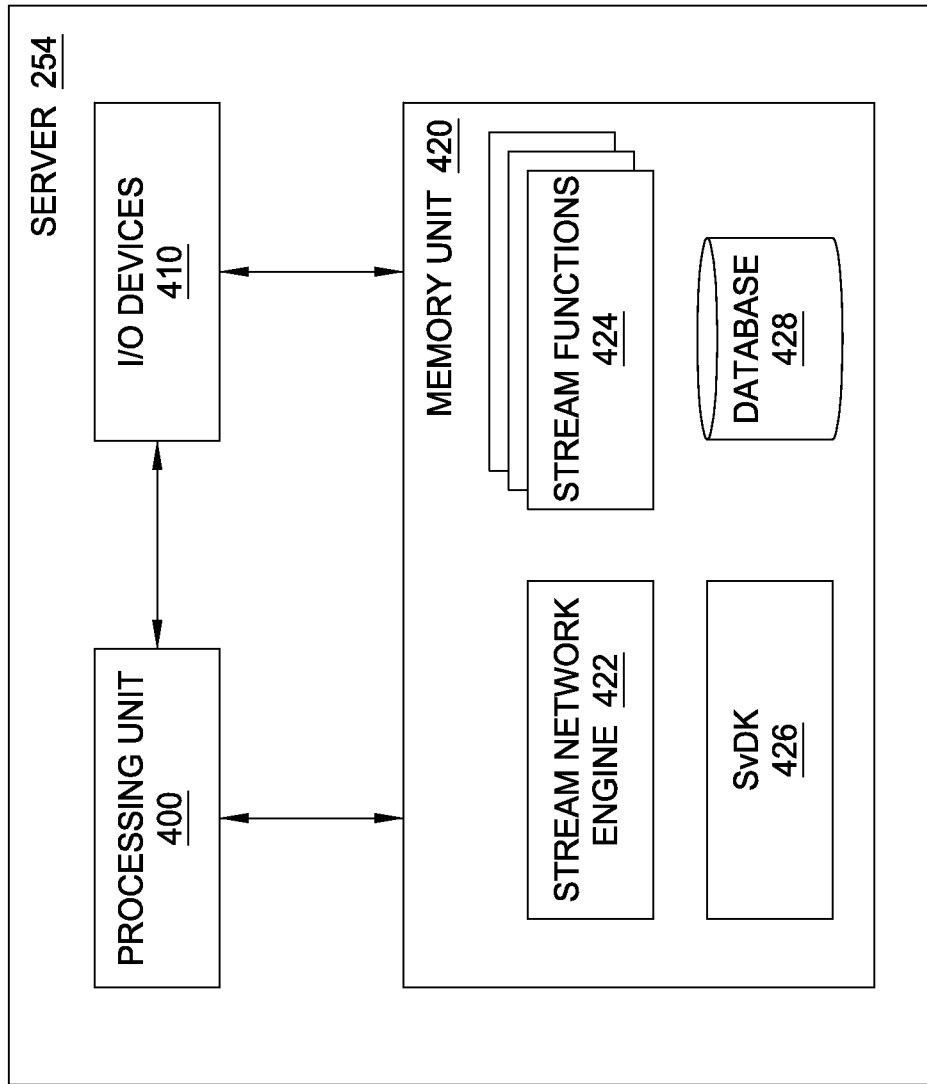
FIG. 4A illustrates a server coupled to the mesh network of FIG. 2, according to one embodiment of the present invention.

FIG. 4A illustrates server 254 that is coupled to wireless mesh network 202 of FIG. 2, according to one embodiment of the present invention. As shown, server 254 includes processing unit 400, input/output (I/O) devices 410, and memory unit 420, coupled together. Memory unit 420 includes stream network engine 422, stream functions 424, stream software developer kit (SvDK) 426, and database 428.

Processing unit 400 may be any technically feasible hardware unit or collection of units configured to process data, including a central processing unit (CPU), a graphics processing unit (GPU), a parallel processing unit (PPU), a field-programmable gate array (FPGA), an application-specific integrated circuit (ASIC), or any combination thereof. Processing unit 400 is configured to perform I/O operations via I/O devices 410, as well as to read data from and write data to memory unit 420. In particular, processing unit 400 is configured to execute program code included in stream network engine 400 and SvDK 426, generate and/or modify stream functions 424, and read from and/or write to database 428.

I/O devices 410 may include devices configured to receive input, such as, e.g., a keyboard, a mouse, a digital versatile disc (DVD) tray, and so forth. I/O devices 410 may also include devices configured to generate output, such as, e.g., a display device, a speaker, a printer, and so forth. I/O devices 410 may further include devices configured to both receive input and generate output, such as a touchscreen, a data port, and so forth. I/O devices generally provide connectivity to the Internet, and, specifically, to wireless mesh network 202.

Memory unit 420 may be any technically feasible unit configured to store data, including a hard disk, random access memory (RAM), etc. The stored data may include structured data sets, program code, software applications, and so forth. Stream network engine 422 is a software application that may be executed by processing unit 400 to establish and maintain the stream network discussed above in conjunction with FIGS. 1-4, and, further, shown below in FIG. 5. In doing so, stream network engine 422 configures nodes 230 within mesh network 202 to execute various stream functions 424. Stream functions 424 may be preconfigured to reside within memory unit 420 of server 254, e.g., by management associated with back office 150 and mesh network 202, or may be specified by utility customers of utility grid 100 via SvDK 426. In one embodiment, the functionality of stream network engine 422 is performed within distributed processing cloud 260 of FIG. 2. In another embodiment, server 150 executes stream network engine 422 to configure distributed processing cloud 260 to manage nodes 230 and/or execute the stream functions described above.

SvDK 426 is a software application that, when executed by processing unit 400, provides a development kit to utility customers that allows creation of stream functions 424. SvDK 426 is a graphical user interface (GUI) that supports drag-and-drop construction of stream functions and/or node monitoring rules, among other possibilities. SvDK 426 is configured to expose an abstract set of libraries to the customer that encapsulates various application programming interface (API) calls. These abstract libraries enable the customer to generate complex stream functions that are implemented by complex underlying code, yet require no actual coding on the part of the customer. An exemplary GUI that may be generated by SvDK 426 is described below in FIG. 4B.

Figure 4B:
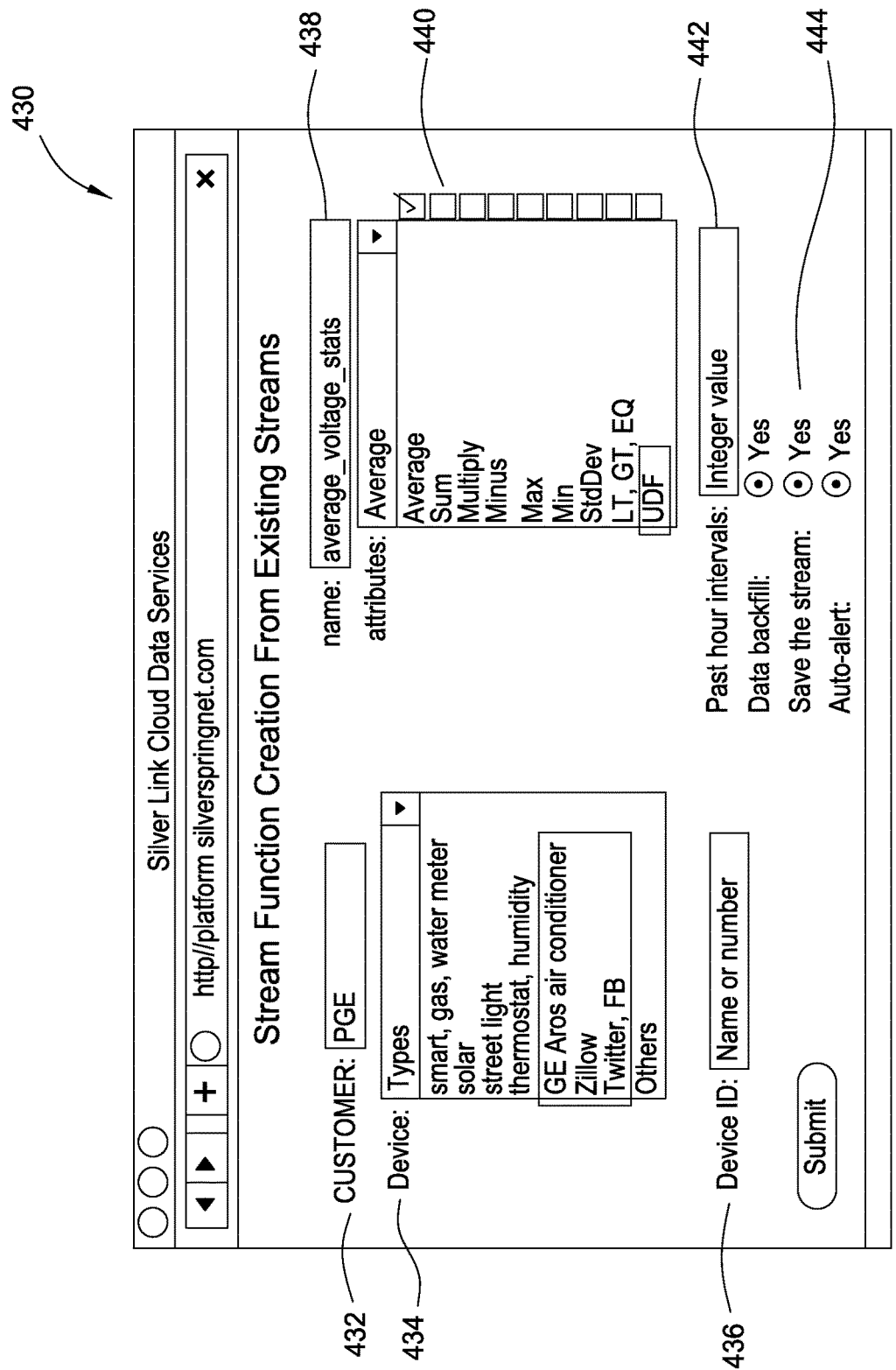
FIG. 4B illustrates a graphical user interface that may be used to generate a stream function, according to one embodiment of the present invention.

FIG. 4B illustrates a GUI 430 that may be used to generate a stream function, according to one embodiment of the present invention. As shown, GUI 430 includes various GUI elements for making different selections and providing various inputs associated with a stream function, including customer selector 432, input selector 434, device ID input 436, name input 438, attributes selector 440, interval input 442, and options buttons 444. A user of SvDK 426 may interact with GUI 430 in order to define a new stream function for execution by a node 230.

In practice, the user selects the customer they represent via customer selector 432, and then identifies, via input selector 434, the specific inputs from which the new stream function should receive data. Those inputs could be derived from specific devices, including other nodes 230, or abstract data sources such as Facebook® or Twitter®. The user may also enter a specific device ID via device ID input 436. The user may then provide a name via name input 438 and select the particular function or functions that should be executed on the source data via attributes selector 440. Interval selector 442 allows the user to adjust the frequency with which the stream function executes. Options buttons 444 allow various other options to be selected. Once the user has configured GUI 430 to include various selections and inputs, the user may submit the stream function defined by those selections and inputs to server 254. In response, server 254 then configures distributed processing cloud 260, nodes 230, and so forth, to execute that stream function.

Referring back now to FIG. 4A, SvDK 426 may include server-side code that executes on processing unit 400 as well as client-side code that executes on a remote computing device associated with a utility customer, as well as code that executes on distributed processing cloud 260. In one embodiment, SvDK 426 may be a web application that provides users with access to a library of function calls for performing data processing on time series data, including raw time series data generated by a node 230 as well as aggregated data stream time series data received from other nodes. The user may specify a stream function by assembling various function calls via the GUI described above in any desired fashion to process the time series data. The library of function calls and other data used by SvDK 426 may be stored in a local database 428, among other places. Those function calls generally encapsulate specific programmatic operations, including database operations and data processing algorithms, without requiring that the user write actual code. Generally, SvDK 426 allows utility customers to customize a specific portion of the stream network that operates in conjunction with mesh network 202. The stream network discussed thus far is described in greater detail below in conjunction with FIG. 5-11.

Smart Grid Processing

Figure 5:
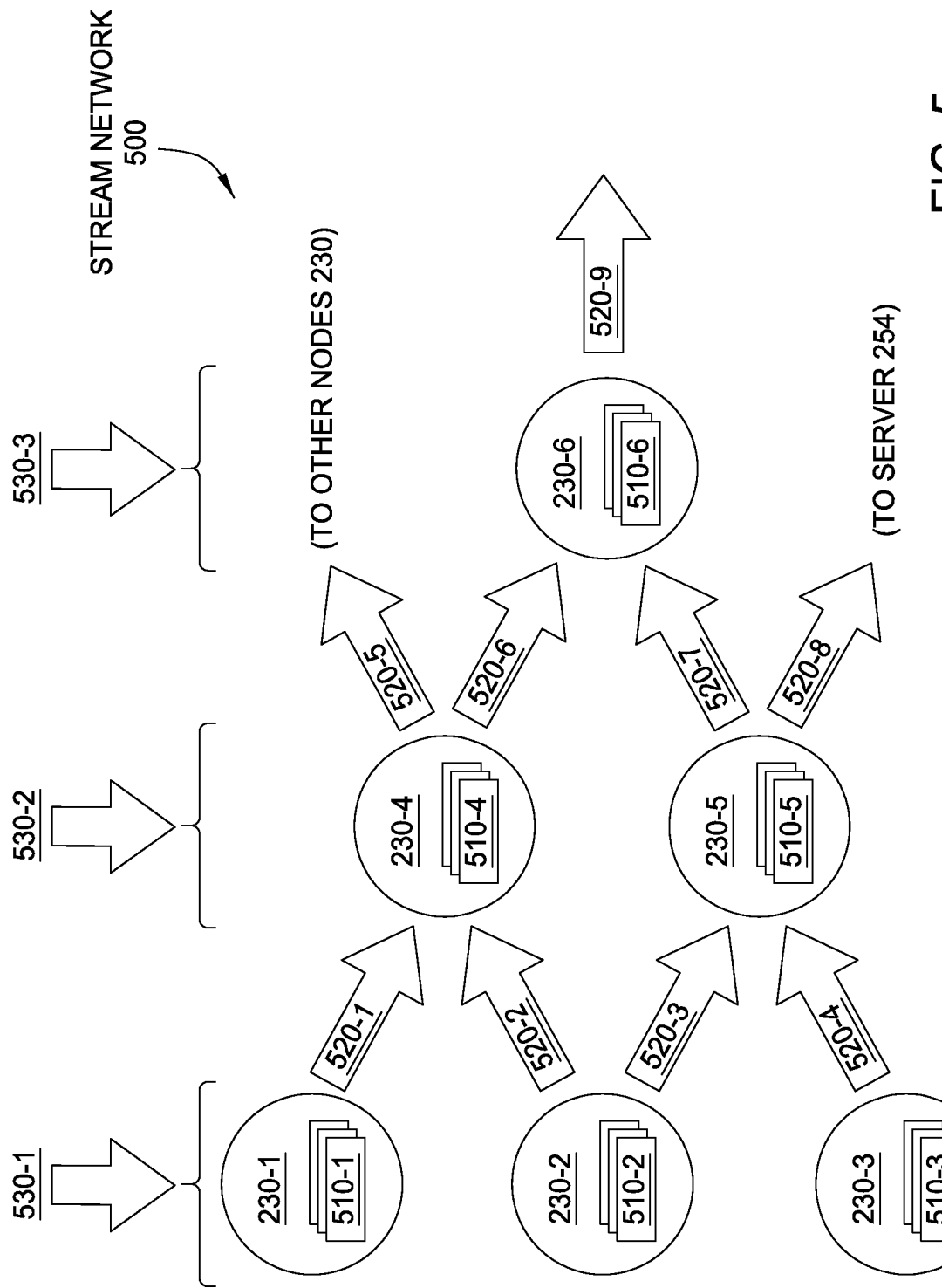
FIG. 5 illustrates a stream network configured to operate in conjunction with the mesh network of FIG. 2, according to one embodiment of the present invention.

FIG. 5 illustrates a stream network 500 configured to operate in conjunction with mesh network 202 of FIG. 2, according to one embodiment of the present invention. Again, as illustrated in greater detail below, stream network 500 operates above mesh network 202 of FIG. 2 in an overall network architecture. As shown, nodes 230 of mesh network 202 execute stream functions 510 in order to generate data streams 520.

Specifically, node 230-1 executes stream functions 510-1 to generate data stream 520-1, node 230-2 executes stream function 510-2 to generate data streams 520-2 and 520-3, node 230-3 executes stream functions 510-3 to generate data stream 520-4, node 230-4 executes stream functions 510-4 to generate data streams 520-5 and 520-6, node 230-5 executes stream functions 510-5 to generate data streams 520-7 and 520-8, and node 230-6 executes stream functions 510-6 to generate stream function 520-9. Each data stream 520 includes a time series of data elements, where each data element includes a data value and a corresponding timestamp indicating a time when the data values was recorded or generated.

A given node 230 may execute one or more stream functions 510 to process raw time series data generated by that node 230. A stream function 510 may be a Boolean operation, such as, e.g., a comparison, or a more complex, higher-level function, such as a correlation operation. The raw time series data processed by stream functions generally includes various types of sensor data, such as voltage data, current measurements, temperature readings, and other types of environmental information. The raw time series data may also include sensor data reflective of the operating conditions of node 230. Further, the raw time series data may include network status information, traffic measurements, and so forth. In one embodiment, each node 230 is configured to access time series data that is derived from various social media outlets, such as Twitter® or Facebook®, among other possibilities. Node 230 could, for example, retrieve tweets in real-time (or near real-time) via an API provided by Twitter®. Node 230 is configured to process the raw time series data to generate one or more data streams 520, and to then transmit the generated data stream(s) 520 to neighboring nodes. Data streams generated by processing raw time series data may be referred to herein as "native data streams."

A given node 230 may also execute one or more stream functions 510 to process data streams 520 received from neighboring nodes 230. A received data stream 520 could be generated by an upstream node 230 based on raw time series data recorded by that node, or generated based on other data streams 520 received by that upstream node. Similar to above, node 230 is configured to process received data streams 520 to generate additional data streams 520, and to then transmit these data stream(s) 520 to neighboring nodes. Data streams generated by processing other data streams may be referred to herein as "abstract data streams."

Upon generating a data stream 520, node 230 is configured to transmit the data stream 520 to back office 150 and/or distributed processing cloud 260, as mentioned. Back office 150 collects data streams 520 from nodes 230 within wireless mesh network 202 and may then perform various additional processing operations with those data streams 520 to identify network events associated with utility network 100 and/or wireless mesh network 202 as well as consumption data. In doing so, server 254 may characterize time series data associated with nodes 230, including raw time series data and received data streams, and then identify network events associated with abnormal patterns within that time series data. Those network events may include voltage sags/swells, downed power lines, appliance malfunctions, potential fires, and fraud, among others. Server 254 may also process time series data to identify expected or normal patterns, including consumption data, quality of service data, etc. Server 254 may then analyze this data to compute load predictions, demand estimations, and so forth.

For example, a given node 230 could be configured to participate in identifying voltage swells (or sags) by executing a stream function that generates a running average of voltage levels associated with the node 230. When the voltage level at a given point in time exceeds (or falls below) the running average by a threshold amount, value, node 230 could alert server 254. Server 254 could then identify that a voltage swell (or sag) is occurring in the region where the node resides. Server 254 could also identify voltage swells or sags by correlating multiple alerts received from multiple nodes 230 residing within the same region. In general, a node 230 may combine data associated with other devices or data streams to draw insights that reflect consumption, service quality and usage, as well as bill forecasts.

In another example, a given node 230 could be configured to execute a stream function that generates a running average of voltage load associated with a transformer to which the node 230 is coupled. When the running average exceeds a threshold level, the node 230 could notify server 254 that a fire may be imminent. The node 230 could also compute the threshold value dynamically by executing a stream function on time series data that reflects ambient temperature associated with the node 230. The node 230 could then adjust the threshold based on the type of transformer, e.g., by executing a stream function to parse nameplate data associated with that transformer and then generate a nominal load value for that particular type of transformer. The node 230 could also receive the threshold value from server 254.

In yet another example, a given node 230 could be configured to participate in identifying fraud by executing a stream function to characterize usage patterns associated with a consumer to which the node 230 is coupled and then identify patterns commonly associated with fraud. When a usage pattern commonly associated with fraud is detected, the node 230 could notify server 254. Such a pattern could be abnormally high consumption compared to neighboring consumers, or divergence between measured load at a transformer coupling a set of meters together and total consumed power at those meters, among other possibilities.

Persons skilled in the art will recognize that stream functions designed for performing computations related to any consumable utility may also be applicable to any other consumable utility. For example, the fraud detection techniques outlined above may be applied to identify loss in the context of water consumption. SvDK 426 of FIGS. 4A-4B is configured to allow stream functions generated for one utility to be applied to performing analogous computations with another utility.

A given node 230 may identify network events based on parsing data streams collected from a social media outlet (such as the Twitter® API, among others). For example, a data stream gathered from a social media outlet could reflect descriptions of downed power lines, fallen trees, and other events that may impact the functionality of wireless mesh network 202 and utility network 100. Node 230 could execute a stream function to search that data stream for specific references to such events. Users that contribute to the social media outlet mentioned above would generally create the descriptions included in the data stream in the form of posts, tweets, etc. Node 230 could assign a credibility factor or confidence value to each user in order to validate those descriptions. In this fashion, node 230, and stream network 500 as a whole, may incorporate qualitative data provided by human beings with some level of confidence.

Generally, stream network 500 may be configured to perform a wide variety of distributed processing operations to identify events occurring within underlying networks, including wireless mesh network 202 and utility network 100. Stream network 500 may also be configured to perform general processing operations (i.e., beyond event identification). In one embodiment, server 254 within back office 150 and/or distributed processing cloud 260 may implement a map-reduce type functionality by mapping stream functions to nodes, and then reducing data streams generated by execution of the mapped stream functions by collecting and processing those data streams. In this fashion, server 254 is capable of configuring stream network 500 to operate as a generic, distributed computing system. Persons skilled in the art will recognize that server 254 may configure stream network 500 to implement any technically feasible form of distributed processing, beyond map-reduce. Generally, stream network 500 reflects a distributed computing system that combines the processing, extrapolation, interpolation, and analysis of data streams using real-time and historical streams via in-line and parallel batch processing.

In one embodiment, server 254 and/or distributed processing cloud 260 are configured to orchestrate the distribution of processing tasks and/or data storage across the various nodes 230 within stream network 500 in a centralized manner. In doing so, server 254 and/or distributed processing cloud 260 may assign specific processing operations to different nodes, allocate particular amounts of data storage to different nodes, and generally dictate some or all configuration operations to those nodes.

In another embodiment, nodes 230 perform a self-orchestration procedure that occurs in a relatively distributed fashion, i.e. without the involvement of a centralized unit such as server 254 or distributed processing cloud 260. In doing so, each node 230 may execute a stream function in order to negotiate processing and/or data storage responsibilities with neighboring nodes. Nodes 230 may perform such negotiations in order to optimize energy usage, processing throughput, bandwidth, data rates, etc. For example, nodes 230 could negotiate a distribution of processing tasks that leverages the processing capabilities of solar powered nodes during daylight hours, and then redistributes those operations to nodes powered by utility network 100 during non-daylight hours. In another example, a group of nodes 230 could negotiate coordinated communications using a specific data rate to optimize power consumption. At any given time, server 254 and/or distributed processing cloud 260 may assume direct control over nodes 230, thereby causing nodes 230 to transition from self-orchestration to centralized orchestration. In a further embodiment, one or more nodes 130 may perform some or all of the functionality associated with server 154, thereby performing various network management related activities from within wireless mesh network 202.

Nodes 230 may initiate specific actions based on the execution of one or more stream function 510. For example, a given node 230 could execute a stream function 510 that compares temperature and humidity values to threshold temperature and humidity values. The node 230 could then determine that both temperature and humidity have exceeded the respective threshold values for a specific amount of time, and then determine that mold growth is likely at the location occupied by the node. The node 230 could then take specific steps to counteract such growth, including activating a ventilation device, or simply notifying back office 150. Generally, each node 230 is configured to both process and respond to recorded time series data, received data streams, and generated data streams and to generate insights and/or alerts based on such monitoring.

When executing a stream function 510, a given node 230 may receive control parameters 530 from back office 150 that influence the execution of those stream functions 510. For example, node 230-1 could receive control parameters 530-1 that reflects an average expected voltage load at node 230-1. Node 230-1 could record the actual voltage load, compare that recorded value to control parameters 530-1, and then perform a specific action based on the result, such as, e.g., report to back office 150 a binary value indicating whether the average expected voltage load was exceeded, among other possibilities. In the above example, one of stream functions 510-1 executed by node 230-1 would reflect the comparison operation between actual and expected voltage loads.

In one embodiment, server 254 may configure nodes 230 to operate according to a policy that indicates guidelines for interacting with the nodes of other networks. Each node 230 configured according to the policy may share network resources, route packets according to, and generally interoperate with those other nodes based on the policy. For example, node 230 could be configured according to a policy that indicates that 40% of traffic received from a network adjacent to the wireless mesh network 202 should be accepted and routed across wireless mesh network 202 on behalf of the adjacent network. In another example, node 230 could be configured according to another policy that indicates that traffic from a first adjacent network should be routed according to a first set of guidelines, while traffic associated with a second adjacent network should be routed according to second set of guidelines. In yet another example, node 230 could be configured according to a policy that specifies how traffic received from one adjacent network should be routed across wireless mesh network 202 in order to reach another adjacent network. The technique described herein allows new nodes 230 to be added to wireless mesh network and then configured according to the same policy or policies already associated with other pre-existing nodes 230 in the wireless mesh network 202. In addition, this technique allows wireless mesh network 202 to operate in a relatively consistent manner across nodes 230 without requiring continuous querying of server 254 with regard to routing decisions. Instead, nodes 230 need only operate according to the configured policy.

As a general matter, different nodes 230 within stream network 500 may receive different control parameters 530.

Each such node 230 may execute stream functions 510, based on received control parameters 530, to process raw time series data and/or received data streams 520. When processing raw time series data, a node 230 may perform error detection and/or correction to modify that time series data, and may also split a given time series into two or more separate time series, as described in greater detail below in conjunction with FIG. 6.

Figure 6:
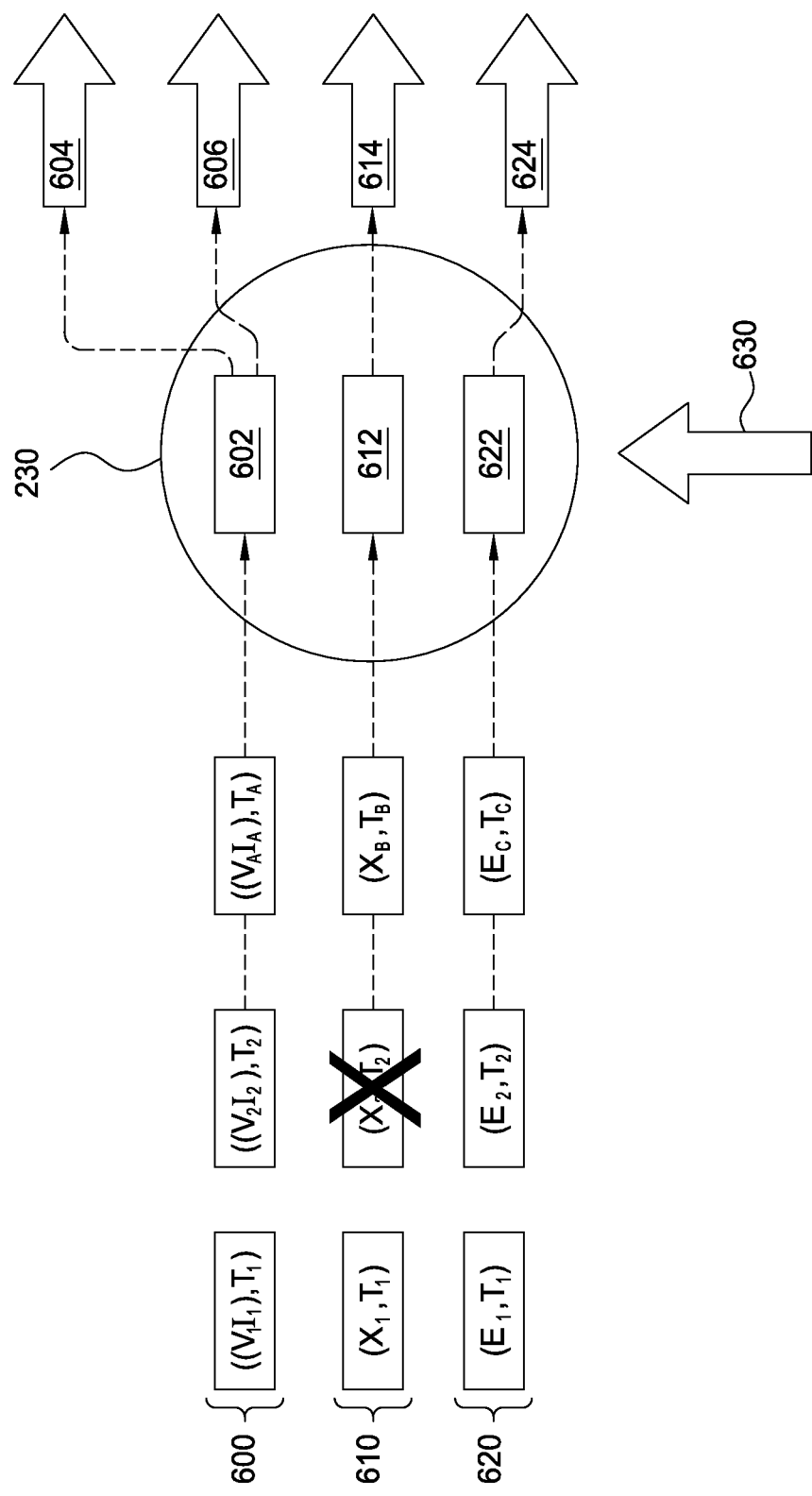
FIG. 6 illustrates an exemplary scenario where a node of FIG. 5 generates a set of data streams based on recorded time series data, according to one embodiment of the present invention.

FIG. 6 illustrates an exemplary scenario where a node of FIG. 5 generates a set of data streams based on recorded time series data, according to one embodiment of the present invention. As shown, node 230 records time series 600, 610, and 620 and receives control parameter 630. Node 230 executes stream functions 602, 612, and 622 with the received time series and, potentially, control parameters 630, in order to generate data streams 604, 606, 614, and 624.

Time series 600, 610, and 620 generally include a series of ordered pairs, where each ordered pair includes a datum and a time stamp. The datum in a given ordered pair could be, e.g., a specific sensor reading, or, alternatively, a collection of sensor readings. The time stamp reflects a specific time when the datum was recorded or computed. Occasionally, portions of a given time series may be corrupted or missing. For example, time series 620 includes a corrupted ordered pair, as is shown. Node 230 is configured to detect missing and/or corrupted data and to take specific action to mitigate such issues. For example, node 230 could execute stream function 612 to substitute a valid ordered pair into time series 610 in place of the missing ordered pair. The substitution operation could be, e.g., a forward-fill operation, among others. Alternatively, node 230 could incorporate a placeholder ordered pair indicating that no data is available for the corresponding time. In other situations, node 230 could execute a stream function to perform error correction, thereby repairing ordered pairs subject to recoverable forms of data corruption. With this approach, network traffic can be reduced because corrupted data need not be transmitted to server 254 for repair. Instead, the data is repaired prior to transmission. In some cases, only a much smaller subset of the computed outputs from data streams can be transmitted to further reduce network bandwidth needs and data latency.

Node 230 is also configured to separate individual time series into multiple, distinct time series. For example, node 230 could execute stream function 602 to separate time series 600 into data streams 604 and 606. As is shown, each ordered pair of time series 600 includes a voltage value and current value recorded at a particular time. Node 230 could execute stream function 602 to generate data stream 604 that reflects only the voltage values from time series 600 as a function of time, as well as data stream 606 that reflects only the current values from time series 600 as a function of time.

In one embodiment, data streams associated with related portions of stream network 500, wireless mesh network 202, and/or utility network 100 may be grouped together in a logical fashion to create "stream structures." For example, a stream structure could include a data stream associated with a transformer that reflects load associated with the transformer. The stream structure could also include one or more data streams associated with smart meters coupled downstream of that transformer and configured to measure downstream consumption. A given node 230 may be configured to group data streams into a stream structure, or server 254 may be responsible for performing that grouping. Grouping data streams in this fashion allows utility customers to generate stream functions that perform computations on an entire stream structure, making certain types of computations simpler to manage.

Persons skilled in the art will understand that node 230 may perform any technically feasible form of real-time data processing to convert a received time series into a data stream. In addition, node 230 may process received data to identify events associated with that data, and then generate a data stream that reflects those events. In this manner, node 230 may be configured to generate a real-time status report. Such a report may reflect the status of node 230 or the network environment associated with node 230. The overall network architecture where node 230 resides, including utility network 100, wireless mesh network 202, and stream network 500, is described in greater detail below in conjunction with FIG. 7.

Figure 7:
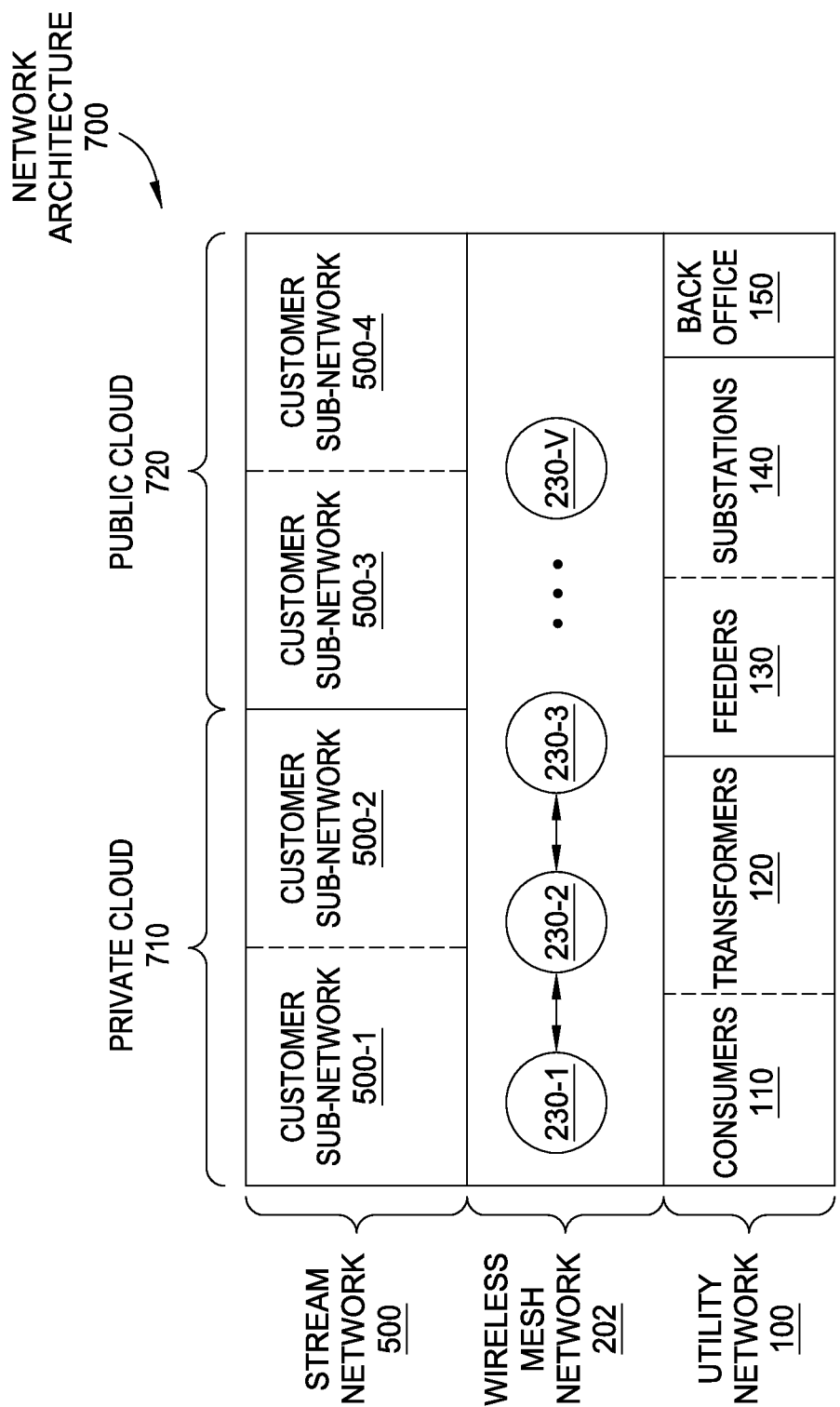
FIG. 7 illustrates an network architecture that includes the utility network of FIG. 1, the mesh network of FIG. 2, and the stream network of FIG. 5, according to one embodiment of the present invention.

FIG. 7 illustrates a network architecture 700 that includes utility network 100 of FIG. 1, wireless mesh network 202 of FIG. 2, and stream network 500 of FIG. 5, according to one embodiment of the present invention. As shown, stream network 500 resides above wireless mesh network 202, which, in turn, resides above utility network 100. Utility network 100 includes the various network elements shown in FIG. 1, and wireless mesh network includes the various nodes 230 discussed above in conjunction with FIGS. 2-3 and 5. As also shown, stream network 500 is subdivided into a private cloud 710 and a public cloud 720. Each of private cloud 710 and public could 720 includes a different set of customer sub-networks 500-1 through 500-4. Customer sub-networks 500-1 through 500-4 generally reflect different portions of stream network 500 that may be configured independently.

In one embodiment, customer sub-networks 500-1 and 500-2 include shared sets of nodes 230, while customer sub-networks 500-3 and 500-4 include separate, dedicated sets of nodes 230. As a general matter, a given customer subscribes to specific data streams generated by the customer sub-network with which that customer is associated. Each customer sub-network 500-1 through 500-4 may be separately configurable and can be maintained, using the techniques previously described for managing stream network 500, by back office 150.

Referring generally to FIGS. 1-7, the network architecture described thus far allows complex, distribute processing to occur at edge locations associated with nodes within that network architecture. Accordingly, data that would otherwise be transmitted to back office 150 for processing can, instead, be processed at or near the location where that data is actually collected. Therefore, data processing can occur in real-time, i.e. while the data is "in-flight," and without substantially increasing network traffic.

In one embodiment, stream network 500 may be integrated into a datacenter and each node 230 of that network may be configured to monitor various qualities of a particular server within that datacenter. A given node 230 may measure temperature, utilization, task load, input/output (I/O) operations, location, and so forth, for a particular server in order to determine the operational status of that server. Stream network 500 as a whole may then aggregate status information across all servers in the datacenter and identify (i) particular servers that are overloaded and should not be assigned new tasks, and (ii) other servers that are underutilized and should be assigned new tasks. Among other things, this approach allows stream network 500 to optimize the speed of I/O operations within the datacenter because tasks involving heavy I/O operations can be assigned to low-temperature servers rather than high-temperature servers, thereby increasing the speed with which those I/O operations may be performed.

The techniques described thus far are also described, in stepwise fashion, below in conjunction with FIGS. 8-11.

Figure 8:
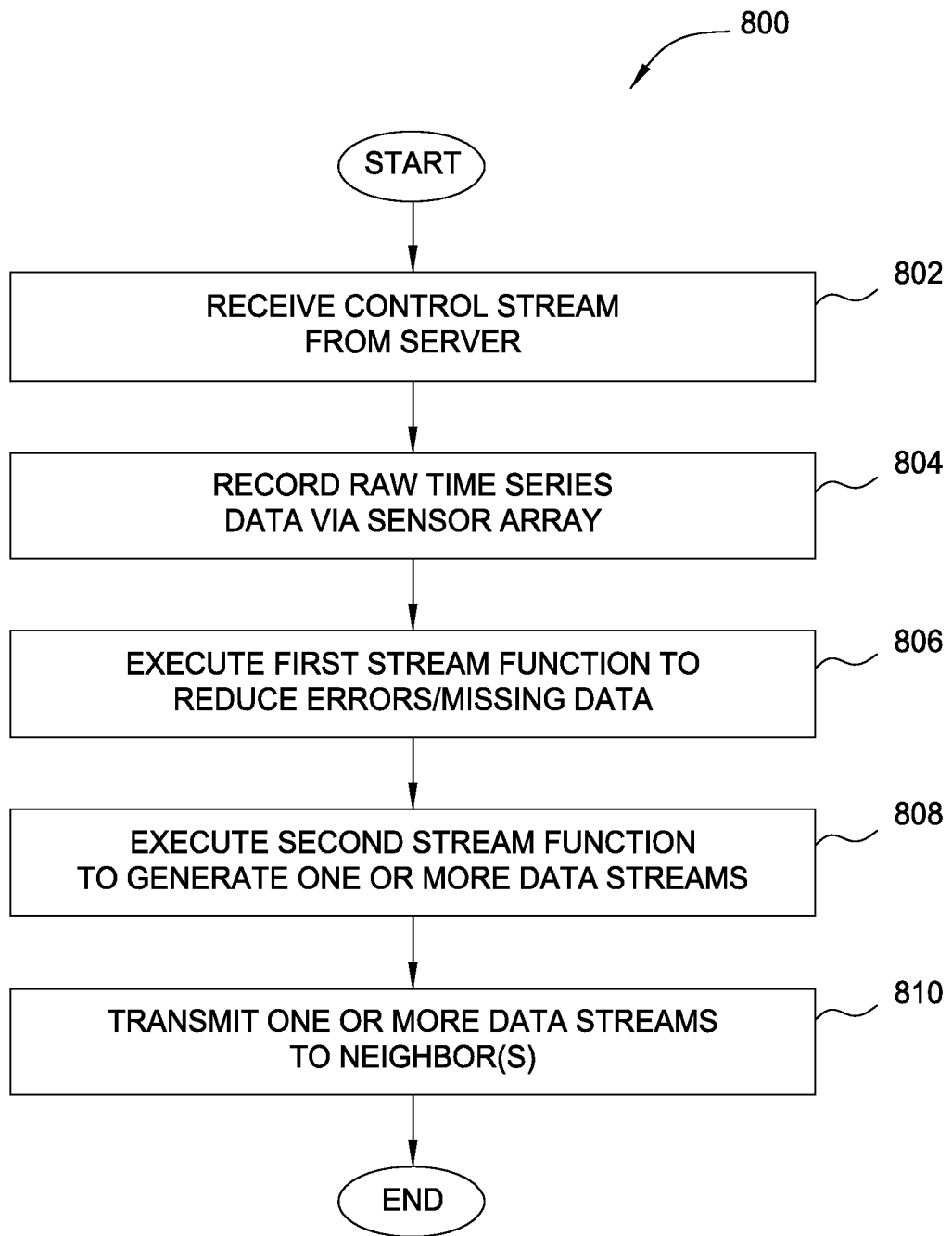
FIG. 8 is a flow diagram of method steps for generating a data stream based on recorded time series data, according to one embodiment of the present invention.

FIG. 8 is a flow diagram of method steps for generating a data stream based on recorded time series data, according to one embodiment of the present invention. Although the method steps are described in conjunction with the systems of FIGS. 1-7, persons skilled in the art will understand that any system configured to perform the method steps, in any order, is within the scope of the present invention.

As shown, a method 800 begins at step 802, where a node 230 within wireless mesh network 202 of FIG. 2, configured to implement a portion of stream network 500 of FIG. 5, receives a stream of control parameters from server 254 within back office 150. The control parameters generally include values to be input to stream functions executed by the node 230. Those values could include, for example, a time-varying average of a quantity measured by the node 230, a threshold value for such a quantity, above which safety issues may arise, or other times of values that influence the execution of a stream function.

At step 804, the node 230 records raw time series data via a sensor array coupled thereto. The node 230 may record a wide variety of different types of data, including environmental data associated with a location where node 230 resides, status information associated with node 230 or the various networks with which node 230 is associated, and other data that varies over time.

At step 806, the node 230 executes a first stream function to detect and/or correct missing or corrupted data in the raw time series data, thereby generating pre-processed data. Node 230 could, for example, determine that the raw time series data has a particular frequency, and therefore should include data for specific intervals of time, and then identify that data is missing for one such interval. Node 230 could also, in another example, perform an error-checking procedure to determine that data in the time series is corrupted. In various embodiments, step 806 may be omitted.

At step 808, the node 230 executes a second stream function to generate one or more data streams based on the pre-processed data. In one embodiment, the node 230 separates the pre-processed data into two or more other time series, thereby generating two or more new data streams. Data streams created in this fashion may be referred to as "native streams" as those streams essentially include raw time series data. The node 230 may also execute the second stream function based on other time series data recorded by the node 230. For example, the node 230 could execute a stream function that compares the pre-processed time series data to another set of time series data, and then generate a new data stream to reflect the result of that comparison.

At step 810, the node 230 transmits the data streams generated at step 808 to one or more neighboring nodes. Each node 230 that receives the data streams transmitted at step 810 may then, in turn, implement a technique for processing received data streams to generate new data streams, as described below in conjunction with FIG. 9. In one embodiment, the steps of method 800 are implemented as a "data pipeline" which is defined by SvDK 426 and executed dynamically by the underlying compute architecture of stream network 500.

Figure 9:
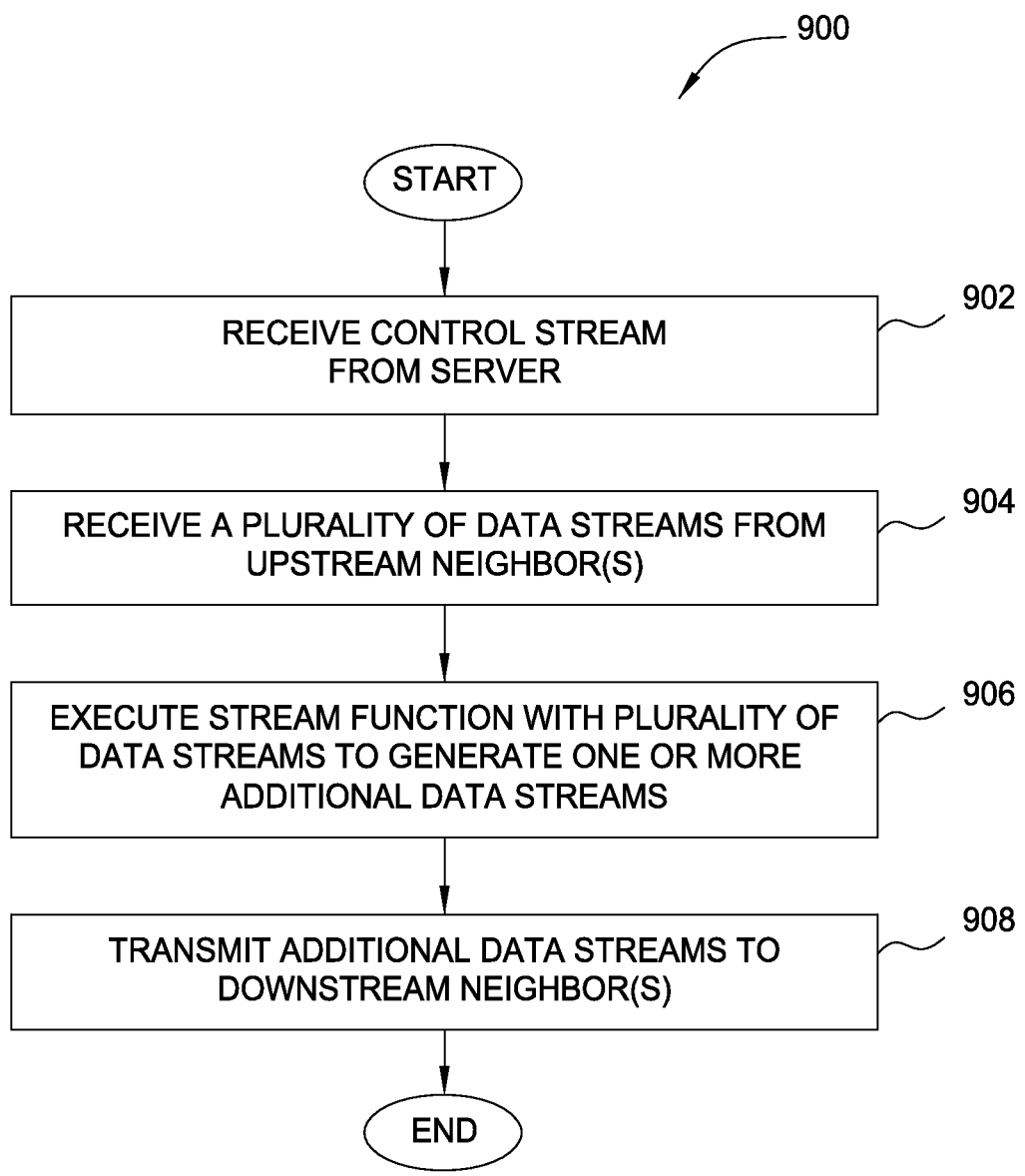
FIG. 9 is a flow diagram of method steps for generating one or more data streams based on one or more received data streams, according to one embodiment of the present invention.

FIG. 9 is a flow diagram of method steps for generating one or more data streams based on one or more received data streams, according to one embodiment of the present invention. Although the method steps are described in conjunction with the systems of FIGS. 1-7, persons skilled in the art will understand that any system configured to perform the method steps, in any order, is within the scope of the present invention.

As shown, at step 902, a node 230 receives a stream of control parameters from server 254 within back office 150, similar to step 802 of the method 800. At step 904, the node 230 receives a plurality of data streams from neighboring, upstream nodes. The upstream nodes may have generated those data streams based on recorded time series data, or, alternatively, may have generated those data streams based on other received data streams. At step 906, the node 230 executes one or more stream functions with the plurality of data streams to generate one or more additional data streams. At step 908, the node 230 transmits the additional data streams to neighboring, downstream nodes.

Referring generally to FIGS. 8-9, persons skilled in the art will understand that an individual node 230 may implement the methods 800 and 900 simultaneously. In addition, an individual node 230 may implement certain steps of the method 800 in conjunction with certain steps of the method 900. For example, a node 230 may execute a given stream function with raw time series data recorded by the node 230 and, additionally, with one or more data streams received by that node.

Server 254 within back office 150, or a collection of servers associated with a datacenter, generally configures nodes 230 within wireless mesh network 202 to implement stream network 500, as previously described herein. Server 254 may then identify various events that may occur within utility network 100 or wireless mesh network 202 by implementing a technique described in greater detail below in conjunction with FIG. 10.

Figure 10:
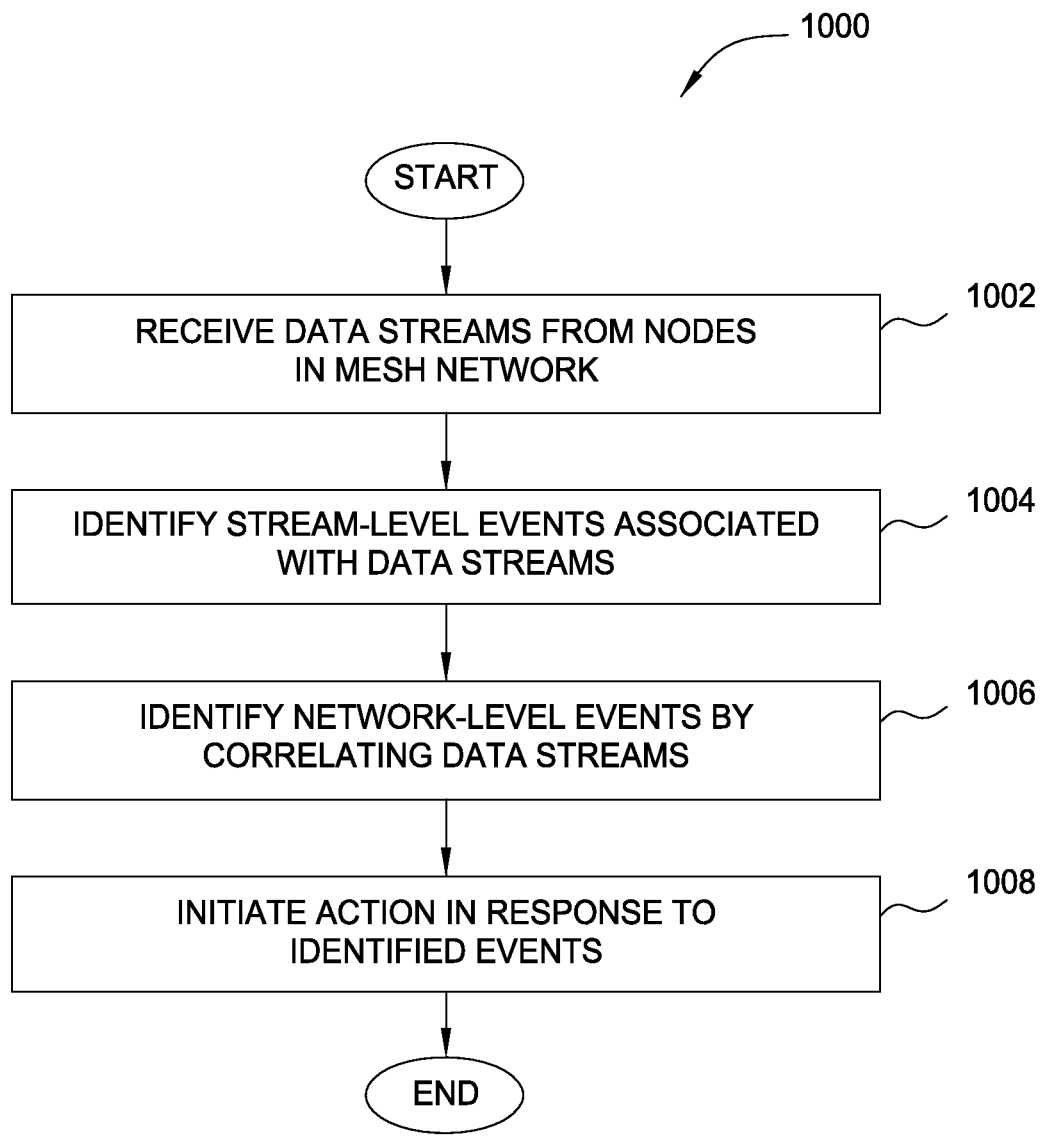
FIG. 10 is a flow diagram of method steps for evaluating conditions associated with the network architecture of FIG. 7, according to one embodiment of the present invention.

FIG. 10 is a flow diagram of method steps for evaluating conditions associated with network architecture of FIG. 7, according to one embodiment of the present invention. Although the method steps are described in conjunction with the systems of FIGS. 1-7, persons skilled in the art will understand that any system configured to perform the method steps, in any order, is within the scope of the present invention.

As shown, a method 1000 begins at step 1002, where server 254 within back office 150 receives data streams from nodes 230 within wireless mesh network 202 configured to implement stream network 500. Each such node could be configured, for example, to implement either or both of the methods 800 and 900 discussed above in conjunction with FIGS. 8-9, respectively.

At step 1004, server 254 identifies stream-level events associated with the received data streams. As referred to herein, a "stream-level event" generally includes any event that is identifiable based on a single data stream. Server 254 could identify, for example, patterns within a particular data stream, or determine that a value associated with a particular data stream exceeds a preset value maintained by server 254, among other possibilities.

At step 1006, server 254 identifies network-level events by correlating data streams or stream-level events with one another. For example, server 254 could identify a power outage or onset of a power outage in a given region by determining that a collection of data streams associated with that region have deviated from respective nominal values by a threshold amount in a correlated fashion consistent with past outage patterns. Server 254 may implement a wide variety of different techniques for correlating data, thereby identifying a multitude of different events within utility network 100 and/or wireless mesh network 202. When processing data streams in the fashion described herein, server 254 may generate a time series of results, where each element of the results time series is generated by processing one or more elements of received data streams and corresponding timestamps.

At step 1008, server 254 initiates one or more actions in response to the identified events. Server 254 may issue commands to individual nodes 230 or groups of nodes 230, including commands for modifying the operating state of those nodes. Server 254 may also power down specific nodes, activate other nodes, or adjust pathways between nodes. Any type of network-oriented action falls within the scope of the present invention. Server 254 may also interact with customers of utility network (or others associated with utility network) 100 in order to customize portions of stream network 500 to implement specific stream functions, as described in greater detail below in conjunction with FIG. 11.

Figure 11:
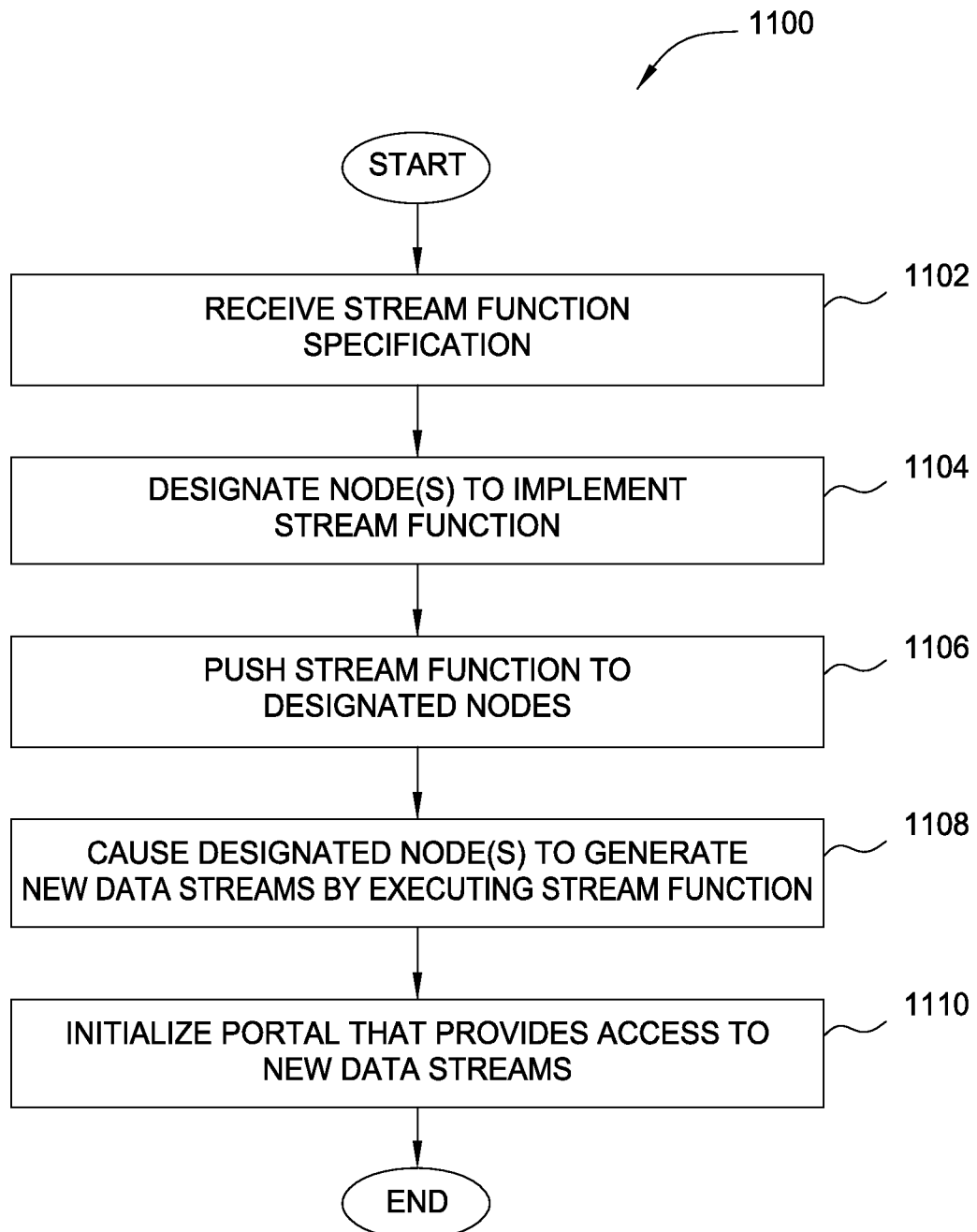
FIG. 11 is a flow diagram of method steps for configuring a node within the stream network of FIG. 5 to generate a data stream, according to one embodiment of the present invention.

FIG. 11 is a flow diagram of method steps for configuring a node within the stream network of FIG. 5 to generate a data stream, according to one embodiment of the present invention. Although the method steps are described in conjunction with the systems of FIGS. 1-7, persons skilled in the art will understand that any system configured to perform the method steps, in any order, is within the scope of the present invention.

As shown, a method 1100 begins at step 1102, where SvDK 426 within server 254 receives a stream function specification. SvDK 426 is a software application configured to generate a user interface through which a user may define a stream function. SvDK 426 could be, for example, a programming environment associated with one or more specific programming languages, or, alternatively, a graphical user interface (GUI) that supports drag-and-drop construction of stream functions, among other possibilities. SvDK 426 may include server-side code that executes on processing unit 400 as well as client-side code that executes on a remote computing device.

At step 1104, SvDK 426 designates one or more specific nodes 230 to execute the stream function specified at step 1102. SvDK 426 may also receive a specific designation from the user of SvDK 426. At step 1106, SvDK 426 pushes the stream function to the nodes 230 designated at step 1104, thereby configuring those nodes to execute the stream function. At step 1108, SvDK 426 causes the designated nodes 230 to generate new data streams by executing the stream functions. A designated node 230 could execute a new stream function with raw time series data recorded by the node and/or with data streams received by the node. At step 1110, SvDK 426 initializes a portal that provides access to the new data streams. The portal could be, for example, a web address that is periodically updated to reflect one or more values associated with the new data streams. In one embodiment, SvDK 426 may also allow the user to specify actions that should be initiated under certain circumstances relative to the newly-configured data streams, including issuing alerts or performing network-level actions.

By implementing the method 1100, SvDK 426 provides a customer of the utility network with the ability to configure a portion of stream network 500 to capture and/or generate specific types of real-time data. Accordingly, a given customer may leverage the computing power of stream network 500 to more effectively manage the operation of utility network 100.

In sum, nodes within a wireless mesh network are configured to monitor time series data associated with a utility network (or any other device network), including voltage fluctuations, current levels, temperature data, humidity measurements, and other observable physical quantities. The nodes execute stream functions to process the recorded time series data and generate data streams. The node is configured to transmit generated data streams to neighboring nodes. A neighboring node may execute other stream functions to process the received data stream(s), thereby generating additional data streams. A server coupled to the wireless mesh network collects and processes the data streams to identify events occurring within the network. The techniques described herein allow the delivery of "data-as-a-service" (DaaS) that represents an interface between the traditional software-as-a-service (SaaS) and platform-as-a-service (PaaS) approaches.

One advantage of the techniques set forth herein is that the stream network allows network processing to occur at edges of the network, i.e., locations within the stream network where data is actually collected. Thus, complex processing involving the network as a whole can be broken down into granular, atomic processing steps that are performed, in a distributed fashion, across the stream network, thereby more effectively leveraging the processing power of the network. In addition, since the data is recorded and then shortly thereafter processed, that data can be processed in a real-time fashion that is not feasible with prior art approaches.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors.

Embodiments of the disclosure may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present disclosure, a user may access applications (e.g., video processing and/or speech analysis applications) or related data available in the cloud.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. One or more non-transitory computer-readable media storing program instructions that, when executed by one or more processors of a network, cause the one or more processors to generate a time series of data values, the network comprising a plurality of nodes and a back office server, by performing the steps of:
   obtaining, from a first sensor array at the first node, a first time series of data values having a first type;
   obtaining, at the first node, a second time series of data values having a second type;
   executing, at the first node, a first stream function on at least a portion of the first time series and at least a portion of the second time series to generate a third time series of data values having a third type;
   transmitting the third time series of data values to a second node in the network;
   executing, at the first node, a negotiating function for distributing processing responsibilities to the first node during daylight hours and distributing processing responsibilities to the second node during non-daylight hours, wherein the first node comprises a solar powered node, and the second node comprises a utility powered node; and
   based on the third time series of data values, issuing, by the second node, one or more commands to a third node that cause the third node to perform at least one of activating the third node or powering down the third node.

2. The one or more non-transitory computer-readable media of claim 1, the steps further comprising:
   causing the first sensor array that is configured to record data values of the first type to generate the first time series of data values; and
   causing a second sensor array that is configured to record data values of the second type to generate the second time series of data values.

3. The one or more non-transitory computer-readable media of claim 1,
   wherein the second time series of data values is received from another node in the network, and
   wherein the another node includes a second sensor array that is configured to record data values of the second type.

4. The one or more non-transitory computer-readable media of claim 1, the steps further comprising:
   causing the first sensor array that is configured to record data values of the first type to generate the first time series of data values,
   wherein the second time series of data values is received from another node in the network, and
   wherein the another node includes a second sensor array that is configured to record data values of the second type.

5. The one or more non-transitory computer-readable media of claim 1, the steps further comprising:
   obtaining a fourth time series of data values having a fourth type; and
   executing a second stream function to separate the fourth time series of data values into a fifth time series of data values having a fifth type and a sixth time series of data values having a sixth type.

6. The one or more non-transitory computer-readable media of claim 1, the steps further comprising performing an error-correction procedure against at least one of the first time series of data values or the second time series of data values to correct missing or corrupted data.

7. The one or more non-transitory computer-readable media of claim 1, the steps further comprising:
grouping the first time series of data values, the second time series of data values, and the third time series of data values into a first stream structure; and
transmitting the first stream structure to at least one node in the network, wherein the first stream structure includes one or more data values associated with a component included within an electricity distribution infrastructure.

8. The one or more non-transitory computer-readable media of claim 1, wherein each data value in the first time series of data values reflects a computed attribute associated with the second time series of data values, and wherein each data value in the third time series of data values reflects a result associated with comparing a data value from the second time series of data values to a data value from the first time series of data values.

9. The one or more non-transitory computer-readable media of claim 8, wherein a first computed attribute comprises an average value associated with a plurality of data values in the second time series of data values, and wherein the result associated with comparing indicates whether a data value from the second time series of data values exceeds a data value from the first time series of data values.

10. The one or more non-transitory computer-readable media of claim 1, wherein executing the first stream function comprises comparing at least the portion of the first time series to at least the portion of the second time series to generate the third time series of data values.

11. The one or more non-transitory computer-readable media of claim 10, wherein the third time series of data values comprises results of the comparison.

12. The one or more non-transitory computer-readable media of claim 1, the steps further comprising identifying, at the second node, a first event associated with the network based on the third time series of data values, and determining the one or more actions based on the first event.

13. The one or more non-transitory computer-readable media of claim 1, wherein the one or more actions modify an operating state of the third node in the network.

14. The one or more non-transitory computer-readable media of claim 1, the steps further comprising:
executing, at the first node, a negotiating function for negotiating a particular data rate with the second node for coordinated communications with the second node.

15. The one or more non-transitory computer-readable media of claim 1, the steps further comprising:
receiving, at the first node and from the back office server, at least one control parameter, wherein executing the first stream function comprises executing the first stream function based on the at least one control parameter.

16. A system configured to generate a time series of data values, comprising:
a first node that resides within a network comprising a plurality of nodes and a back office server, the first node including:
a memory configured to store program code, and
a processor that is coupled to the memory and, when executing the program code, is configured to:
obtain, from a first sensor array, a first time series of data values having a first type,
obtain a second time series of data values having a second type,
execute a first stream function on at least a portion of the first time series and at least a portion of the second time series to generate a third time series of data values having a third type,
transmit the third time series of data values to a second node in the network, and
execute a negotiating function for distributing processing responsibilities to the first node during daylight hours and distributing processing responsibilities to the second node during non-daylight hours, wherein the first node comprises a solar powered node, and the second node comprises a utility powered node; and
the second node configured to:
based on the third time series of data values, issue one or more commands to a third node that cause the third node to perform at least one of activating the third node or powering down the third node.

17. The system of claim 16, wherein the first node further includes:
the first sensor array that is coupled to an underlying network and is configured to record, from the underlying network, data values of the first type to generate the first time series of data values, and
a second sensor array that is coupled to the underlying network and configured to record, from the underlying network, data values of the second type to generate the second time series of data values.

18. The system of claim 16, further comprising:
a first upstream node, including the first sensor array that is coupled to an underlying network and configured to record, from the underlying network, data values of the first type for transmission to the first node; and
a second upstream node, including a second sensor array that is coupled to the underlying network and configured to record, from the underlying network, data values of the second type for transmission to the first node,
wherein the first node, the first upstream node, and the second upstream node are configured to exchange a plurality of time series of data values in order to form an overarching network.

19. The system of claim 16, wherein the first node further includes:
the first sensor array that is coupled to an underlying network and configured to record, from the underlying network, data values of the first type to generate the first time series of data values; and
the processor is further configured to receive the second time series of data values from a second upstream node in the network, wherein the second upstream node includes a second sensor array that is coupled to the underlying network and configured to record, from the underlying network, data values of the second type,
wherein the first node and the second upstream node are configured to exchange a plurality of time series of data values in order to form an overarching network.

20. The system of claim 16, wherein the processor is further configured to obtain a fourth time series of data values having a fourth type; and
execute a second stream function to compress the fourth time series of data values into a fifth time series of data values having the fourth type.

21. The system of claim 16, wherein a data value having the first type comprises a first measurable or computable attribute of a portion of an electricity distribution infrastructure underlying the network, wherein a data value having the second type comprises a second measurable or computable attribute of the portion of the electricity distribution infrastructure underlying the network.

22. The system of claim 16, wherein the first time series of data values and the second time series of data values are derived from an underlying network, and the third time series of data values comprises a portion of an overarching network.

23. A computer-implemented method for generating a time series of data values, the method comprising:
   obtaining, from a first sensor array at a first node included in a network comprising a plurality of nodes and a back office server, a first time series of data values having a first type;
   obtaining, at the first node, a second time series of data values having a second type;
   executing, at the first node, a first stream function on at least a portion of the first time series and at least a portion of the second time series to generate a third time series of data values having a third type;
   transmitting the third time series of data values to a second node in the network;
   executing, at the first node, a negotiating function for distributing processing responsibilities to the first node during daylight hours and distributing processing responsibilities to the second node during non-daylight hours, wherein the first node comprises a solar powered node, and the second node comprises a utility powered node; and
   based on the third time series of data values, issuing, by the second node, one or more commands to a third node that cause the third node to perform at least one of activating the third node or powering down the third node.

24. The computer-implemented method of claim 23, further comprising:
   causing the first sensor array that is configured to record data values of the first type to generate the first time series of data values; and
   causing a second sensor array that is configured to record data values of the second type to generate the second time series of data values, or
   receiving the second time series of data values from another node in the network that is configured to record data values of the second type from the underlying network.

25. The computer-implemented method of claim 23, further comprising:
   generating a user interface that reflects a plurality of time series of data values and a plurality of stream functions;
   receiving a first selection of the first time series of data values from within the plurality of time series of data values;
   receiving a second selection of the second time series of data values from within the plurality of time series of data values;
   receiving a third selection of the first stream function; and
   configuring another node within the network based on the first selection, the second selection, and the third selection.

26. The computer-implemented method of claim 25, wherein the first node obtains the first time series of data values and the second time series of data values based on sensor readings associated with an underlying network, and wherein the first node transmits the third time series of data values to form a portion of an overarching network.

* * * * *